(12) United States Patent
Kashihara

(10) Patent No.: US 10,978,154 B2
(45) Date of Patent: Apr. 13, 2021

(54) SEMICONDUCTOR DEVICE

(71) Applicant: RENESAS ELECTRONICS CORPORATION, Tokyo (JP)

(72) Inventor: Yoji Kashihara, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 162 days.

(21) Appl. No.: 16/250,324

(22) Filed: Jan. 17, 2019

(65) Prior Publication Data

US 2019/0259455 A1    Aug. 22, 2019

(30) Foreign Application Priority Data

Feb. 22, 2018    (JP) .............................. JP2018-030032

(51) Int. Cl.

| | | |
|---|---|---|
| G11C 11/34 | (2006.01) |
| G11C 16/08 | (2006.01) |
| G11C 8/08 | (2006.01) |
| G11C 16/04 | (2006.01) |
| G11C 16/12 | (2006.01) |
| G11C 16/14 | (2006.01) |

(52) U.S. Cl.
CPC ............... G11C 16/08 (2013.01); G11C 8/08 (2013.01); G11C 16/0408 (2013.01); G11C 16/0425 (2013.01); G11C 16/0466 (2013.01); G11C 16/12 (2013.01); G11C 16/14 (2013.01)

(58) Field of Classification Search
CPC ............ G11C 18/0408; G11C 16/0425; G11C 16/0466; G11C 16/08
USPC ..................................................... 365/185.11
See application file for complete search history.

(56) References Cited

U.S. PATENT DOCUMENTS

| | | | |
|---|---|---|---|
| 6,711,058 B1 | 3/2004 | Hirano | |
| 8,483,004 B2 | 7/2013 | Ito | |
| 2005/0232013 A1* | 10/2005 | Kawai ................ | G11C 16/3459 365/185.18 |

(Continued)

FOREIGN PATENT DOCUMENTS

JP    2011-165269 A    8/2011

OTHER PUBLICATIONS

Extended European Search Report issued in corresponding European Patent Application No. 19155253.8-1203, dated Jul. 29, 2019.

*Primary Examiner* — Huan Hoang
*Assistant Examiner* — Minh Dinh
(74) *Attorney, Agent, or Firm* — McDermott Will & Emery LLP

(57) ABSTRACT

A semiconductor device includes first and second voltage control lines for a first memory block and third and fourth voltage control lines for a second memory block, for driving gate lines for memory transistors; a first decoder driving the first and third voltage control lines; a second decoder driving the second and fourth voltage control lines; and a control circuit controlling a voltage for the first and second decoders. The control circuit supplies a first voltage and a second voltage lower than the first voltage to the first decoder and a third voltage between the first and second voltages, and the second voltage to the second decoder, before writing operation; and supplies the first voltage and the third voltage to the first decoder and a fourth voltage between the third and second voltages, and a fifth voltage lower than the second voltage to the second decoder, in the writing operation.

15 Claims, 26 Drawing Sheets

(56) References Cited

U.S. PATENT DOCUMENTS

2012/0134210 A1* 5/2012 Maeda ................... G11C 16/26
365/185.11
2016/0180941 A1 6/2016 Kato
2016/0225453 A1* 8/2016 Kashihara .............. G11C 16/14

* cited by examiner

SELECTED BLOCK/
SELECTED CELL
(WRITING)

SELECTED BLOCK/
NON-SELECTED CELL
(NON-WRITING)

NON-SELECTED BLOCK/
SELECTED CELL
(NON-WRITING)

NON-SELECTED BLOCK/
NON-SELECTED CELL
(NON-WRITING)

SELECTED BLOCK/
SELECTED CELL
(ERASING)

SELECTED BLOCK/
NON-SELECTED CELL
(NON-ERASING)

NON-SELECTED BLOCK/
SELECTED CELL
(NON-ERASING)

NON-SELECTED BLOCK/
NON-SELECTED CELL
(NON-ERASING)

FIG. 7

| | INITIAL STATE [IS] | WRITING WAIT [PH] | WRITING APPLIED [PP] | ERASING WAIT [EH] | ERASING APPLIED [EP] |
|---|---|---|---|---|---|
| VMGBPP | VDD | VPPA | VPPA | VPPA | VDD |
| VMGBPN | VSS | VSS | VPPC | VSS | VEES |
| VMGBNP | VDD | VPPC | VDD | VPPC | VDD |
| VMGBNN | VSS | VSS | VEES | VSS | VEEM |
| VMGPP | VDD | VPPA | VPPA | VPPA | VDD |
| VMGPN | VSS | VSS | VPPC | VSS | VEES |
| VMGNP | VDD | VPPC | VPPC | VPPA | VDD |
| VMGNN | VSS | VSS | VDD | VSS | VEEM |

FIG. 14

| | INITIAL STATE [IS] | WRITING WAIT [PH] | WRITING APPLIED [PP] | ERASING WAIT [EH] | ERASING APPLIED [EP] |
|---|---|---|---|---|---|
| MGBPL_s | VSS | VPPA | VPPA | VPPA | VDD |
| MGBPL_u | VSS | VSS | VPPC | VSS | VDD |
| MGBNL_s | VSS | VPPC | VDD | VPPC | VEEM |
| MGBNL_u | VSS | VSS | VPPC | VSS | VDD |
| MGPL_s | VDD | VPPA | VPPA | VPPA | VDD |
| MGPL_u | VDD | VSS | VDD | VSS | VEES |
| MGNL_s | VDD | VPPC | VPPC | VPPA | VDD |
| MGNL_u | VDD | VSS | VPPA | VSS | VEEM |
| MGL_ss | VSS | VPPA | VPPA | VSS | VEEM |
| MGL_su | VSS | VSS | VDD | VSS | VDD |
| MGL_us | VSS | Hi-Z | VDD | VSS | Hi-Z |
| MGL_uu | VSS | VSS | VDD | VSS | VDD |

FIG. 15

| | INITIAL STATE [IS] | WRITING WAIT [PH] | WRITING APPLIED [PP] | ERASING WAIT [EH] | ERASING APPLIED [EP] |
|---|---|---|---|---|---|
| VPPA | VDD(1V) | 5V | 11V | 5V | 10V |
| VPPB | VDD(1V) | 3V | 7V | 3V | 7V |
| VPPC | VDD(1V) | 3V | 3V | 3V | 3V |
| VPPR | 5V | 5V | 5V | 5V | 5V |
| VEEM | VSS(0V) | -3V | -3V | -3V | -8V |
| VEEV | VSS(0V) | -0.5V | -0.5V | -0.5V | -0.5V |
| VEES | VSS(0V) | -0.5V | -0.5V | -0.5V | -0.5V |

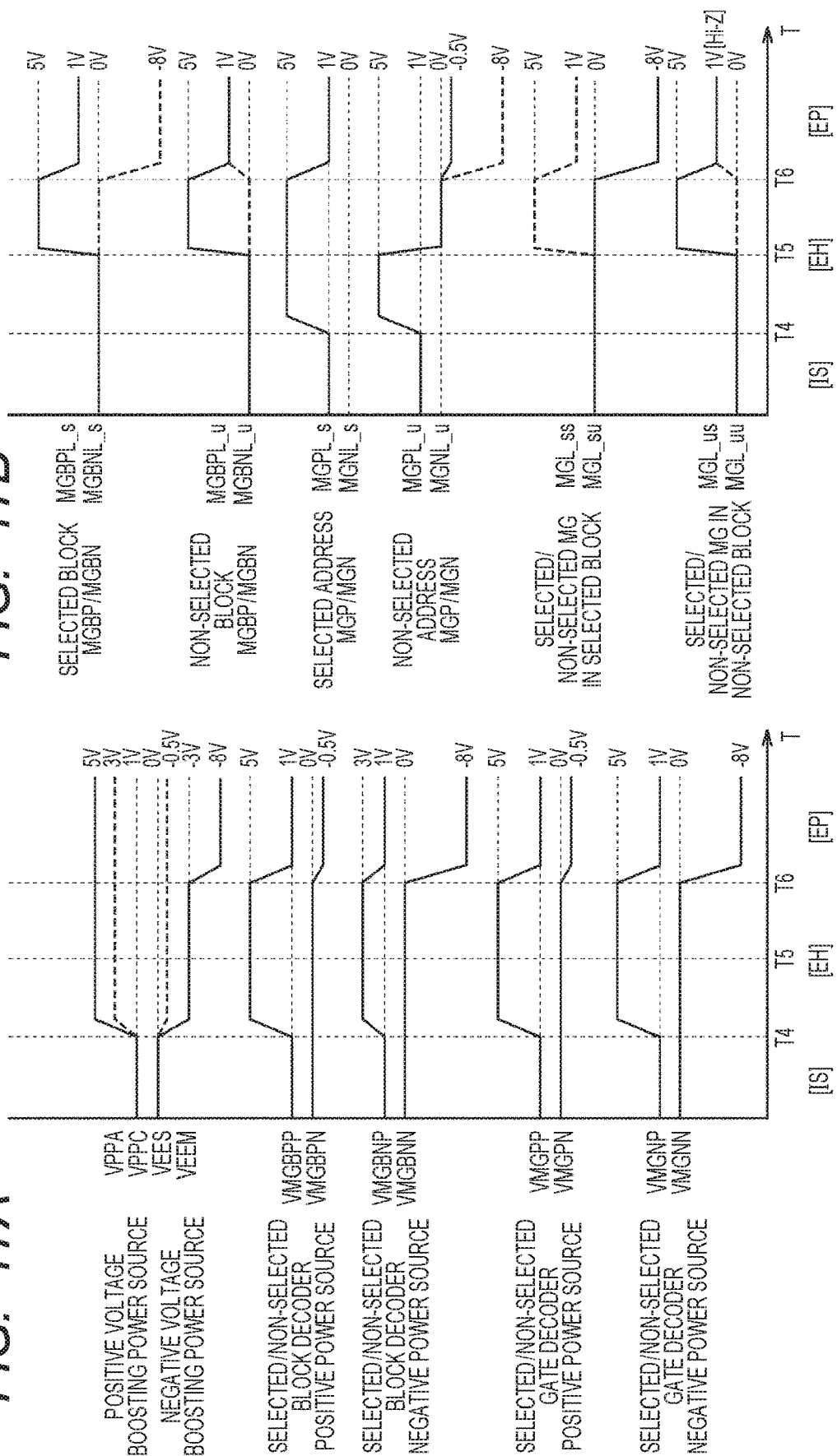

SEMICONDUCTOR DEVICE

CROSS-REFERENCE TO RELATED APPLICATIONS

The disclosure of Japanese Patent Application No. 2018-030032 filed on Feb. 22, 2018 including the specification, drawings and abstract is incorporated herein by reference in its entirety.

BACKGROUND

This disclosure relates to a level shift circuit and further to a decode circuit that outputs an output signal having a different voltage from an input signal.

The power source used for a logic mixed non-volatile memory circuit is various. There are generally used a low voltage power source (VDD, about 1 V) in a logic circuit portion, a medium voltage power source (VCC, about 3 V) used in a peripheral circuit of a non-volatile memory, and further a positive high voltage power source (VPP, about 11 V at maximum) and a negative high voltage power source (VEE, about −8V at maximum) generated by boosting the voltage from the medium voltage power source used for writing and erasing in a memory cell (refer to Japanese Unexamined Patent Application Publication No. 2011-165269).

A low voltage MOS transistor used for the logic circuit portion is getting down in scale and miniaturization is advancing year by year. According to this, it is necessary to operate the transistor with a lower power source voltage in terms of withstand voltage, which results in decreasing the voltage of the low voltage power source.

On the other hand, a high voltage MOS transistor forming a non-volatile memory portion such as a flash memory is difficult to miniaturize and still keeps a medium voltage and a high voltage as ever.

A decode circuit that handles a high voltage needs to be basically formed by a high voltage MOS transistor. Nevertheless, the decode circuit needs to handle a signal of a low voltage power source level inside itself.

When the voltage level of a low voltage power source gets lower than the threshold voltage of the high voltage MOS transistor, there occurs such a situation that a signal having the voltage level of the low voltage power source cannot be handled normally.

SUMMARY

In order to solve the above problem, the invention is to provide a semiconductor device capable of handling a signal having the voltage level of a low voltage power source stably.

Other objects and novel characteristics will be apparent from the description of the specification and the attached drawings.

A semiconductor device according to the aspects of this disclosure includes first and second memory blocks having a plurality of memory transistors of storing data according to a level change of the threshold voltage and a plurality of memory gate lines of supplying each voltage to each gate of the memory transistors. The semiconductor device further includes first and second voltage control lines provided correspondingly to the first memory block, for driving the plural memory gate lines, and third and fourth voltage control lines provided correspondingly to the second memory block, for driving the plural memory gate lines. The semiconductor device further includes a first decoder of driving the first and the third voltage control lines, a second decoder of driving the second and the fourth voltage control lines, and a voltage control circuit of controlling a voltage to be supplied to the first and the second decoders. The voltage control circuit supplies a first voltage and a second voltage lower than the first voltage to the first decoder and supplies a third voltage between the first voltage and the second voltage and the second voltage to the second decoder, before the writing operation. The voltage control circuit supplies the first voltage and the third voltage to the first decoder and supplies a fourth voltage between the third voltage and the second voltage and a fifth voltage lower than the second voltage to the second decoder, in the writing operation mode.

According to one embodiment, the semiconductor device can handle a signal having a voltage level of a low voltage power source stably.

BRIEF DESCRIPTION OF THE DRAWINGS

FIG. 7 is a view for use in describing a selected state of a boosting power source in writing and erasing mode of the high voltage switch circuit.

FIG. 9 is a view for use in describing a structure of an MGBP decoder that drives a voltage control line at a high potential side in the block decoder 24a.

FIG. 10 is a view for use in describing a structure of an MGBN decoder that drives the voltage control line at a low potential side in the block decoder 24a.

FIG. 14 is a view for use in describing the state of the voltage control line and the memory gate line in the writing and erasing state in the high voltage decoder circuit.

FIG. 15 is a view for use in describing an output example of the boosting voltage in each state, for realizing a bias state of a memory cell.

FIG. 17A and FIG. 17B are timing charts for use in describing the voltage and the voltage control line in the erasing operation mode.

DETAILED DESCRIPTION

Figure 1:
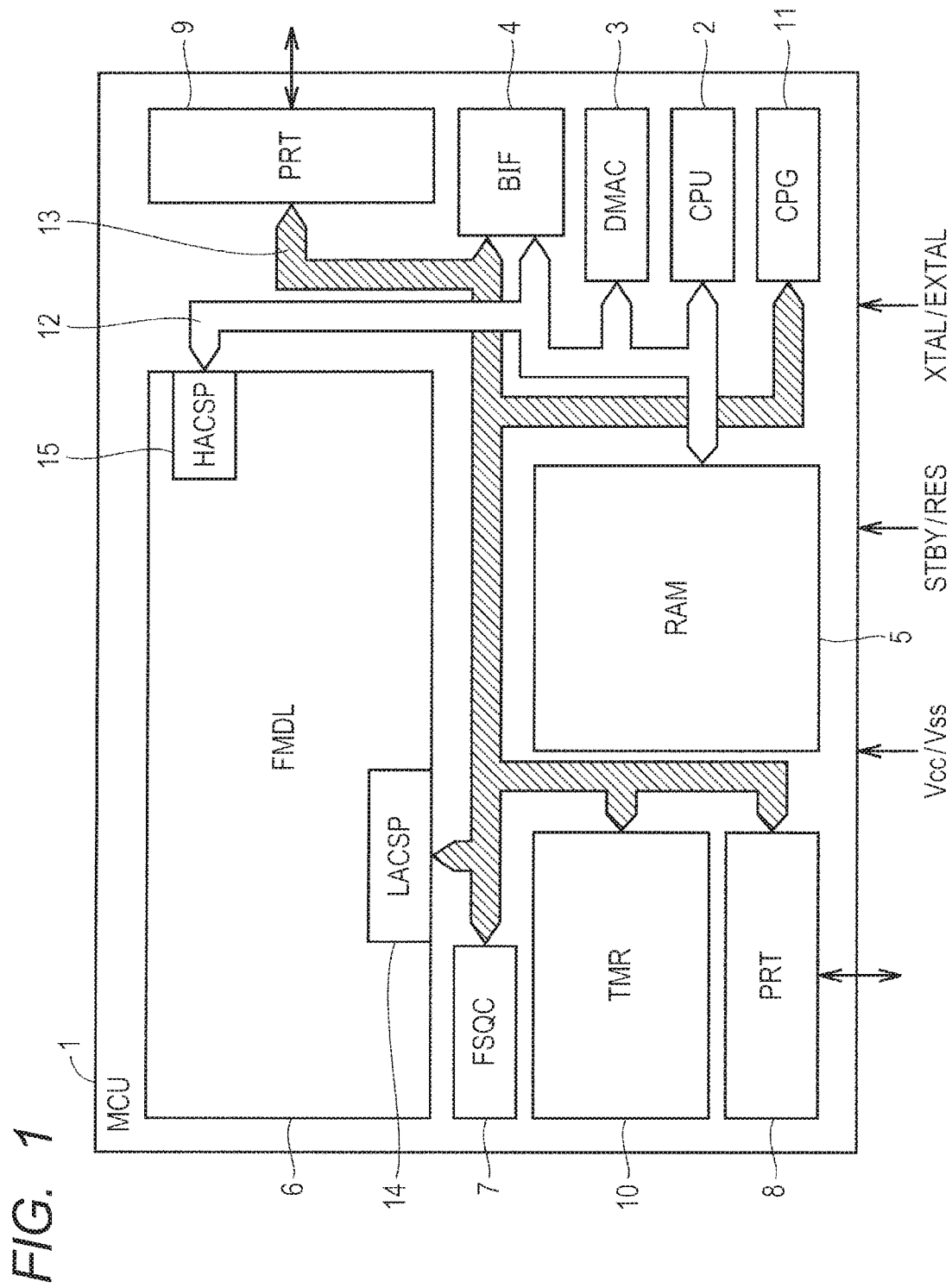
FIG. 1 is a block diagram showing a structure of a semiconductor device according to a first embodiment.

Hereinafter, each embodiment will be specifically described with reference to the drawings. Although a microcomputer including a flash memory module will be described as one example of a semiconductor device including a level shifter, the semiconductor device is not restricted to the following example. For example, a semiconductor device may be formed by only a flash memory. The technique of this disclosure can be applied to any semiconductor device as far as it includes a level shifter.

In the following description, the same reference numerals are attached to the same or corresponding portions and their description is not repeated.

First Embodiment

[Microcomputer]

FIG. 1 is a block diagram showing a structure of a semiconductor device according to a first embodiment.

FIG. 1 shows a structure of a microcomputer or a micro controller unit (MCU: Micro Controller Unit) 1 as an example of a semiconductor device.

With reference to FIG. 1, the microcomputer 1 is formed on one semiconductor chip of single crystal silicon and the like, for example, according to the Complementary Metal Oxide Semiconductor (CMOS) integrated circuit manufacturing technique.

As shown in FIG. 1, the microcomputer 1 includes a central processing unit (CPU) 2, a random access memory (RAM) 5, and a flash memory module (FMDL) 6. The central processing unit 2 includes an instruction control unit and an execution unit, to execute instructions. The random access memory 5 is used for a work region of the central processing unit 2. The flash memory module 6 is provided as a non-volatile memory module of storing data and program.

The microcomputer 1 further includes a direct memory access controller (DMAC) 3, a bus interface circuit (BIF) 4, a flash sequencer (FSQC) 7, external input/output ports (PRT) 8 and 9, a timer (TMR) 10, a clock pulse generator (CPG) 11, a high speed bus (HBUS) 12, and a peripheral bus (PBUS) 13.

The bus interface circuit 4 performs a bus interface control or a bus bridge control between the high speed bus 12 and the peripheral bus 13. The flash sequencer 7 performs a command access control on the flash memory module (FMDL) 6. The clock pulse generator 11 generates an internal clock CLK for controlling the microcomputer 1.

The bus structure of the microcomputer 1 is not particularly restricted but in the case of FIG. 1, the high speed bus (HBUS) 12 and the peripheral bus (PBUS) 13 are provided. The high speed bus 12 and the peripheral bus 13 are not particularly restricted but each includes a data bus, an address bus, and a control bus. By providing the two buses, the high speed bus 12 and the peripheral bus 13, it is possible to reduce the load of a bus compared with the case of coupling all the circuits to one common bus and assure a high speed access operation.

The high speed bus 12 couples the central processing unit 2, the direct memory access controller 3, the bus interface circuit 4, the random access memory 5, and the flash memory module 6. The peripheral bus 13 couples the flash sequencer 7, the external input/output ports 8 and 9, the timer 10, and the clock pulse generator 11.

The microcomputer 1 further includes clock terminals XTAL and EXTAL to which an oscillator is coupled or an external clock is supplied, an external hardware standby terminal STB instructing a standby state, and an external reset terminal RES instructing a reset. The microcomputer 1 further includes terminals for respectively receiving the power source voltage VDD for digital circuit, the power source voltage VCC for analog circuit, and the ground voltage VSS.

FIG. 1 shows the flash sequencer 7 as a logic circuit and the flash memory module 6 of an array structure as separate circuit blocks for the sake of convenience, because of being designed using different CAD tools; however, the both may be combined together and formed as one flash memory module 6.

The flash memory module 6 is coupled to the high speed bus (HBUS) 12 through the high speed access port (HACSP) 15 for exclusive use of reading. The central processing unit 2 or the direct memory access controller 3 can gain a read access to the flash memory module 6 through the high speed bus 12 via the high speed access port 15. The central processing unit 2 or the direct memory access controller 3 issues a command to the flash sequencer 7 via the bus interface circuit 4 through the peripheral bus (PBUS) 13 when gaining write and initialization accesses to the flash memory module 6. In reply to this command, the flash sequencer 7 controls the initialization and writing operation of the flash memory module through the peripheral bus PBUS via the low speed access port (LACSP) 14.

[Flash Memory Module]

Figure 2:
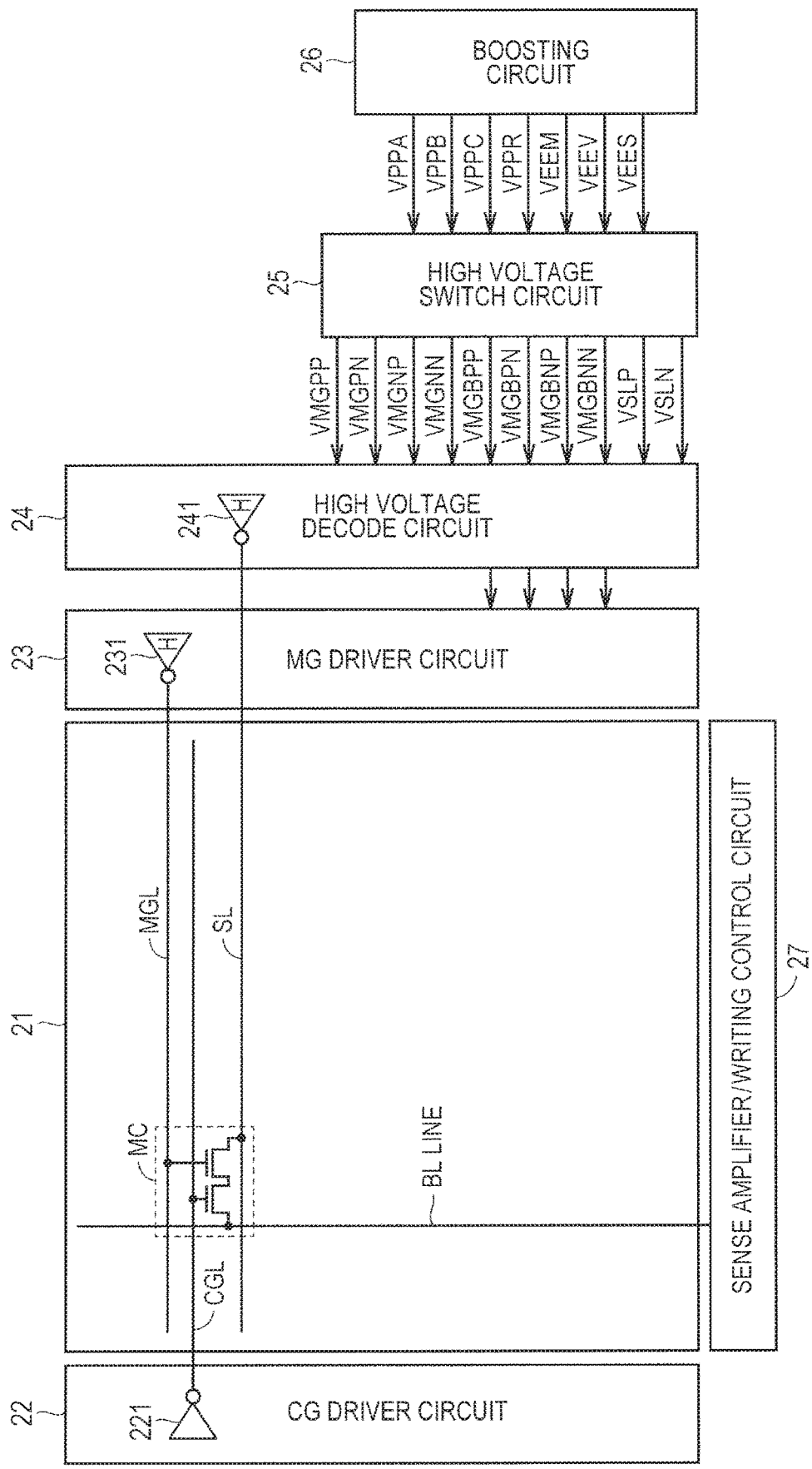
FIG. 2 is a block diagram showing a structure of a flash memory module (FMDL) in FIG. 1.

FIG. 2 is a block diagram showing a structure of the flash memory module (FMDL) of FIG. 1.

The flash memory module 6 includes a memory cell array 21, a CG driver circuit 22, an MG driver circuit 23, a high voltage decode circuit 24, a high voltage switch circuit 25, a boosting circuit 26, and a sense amplifier/writing control circuit 27.

The memory cell array 21 includes a plurality of memory cells MC arranged in an array shape. In FIG. 2, only one memory cell MC is typically shown. As shown in FIGS. 2 to 4D, this disclosure will be described taking the memory cell MC of Metal Oxide Nitride Oxide Silicon (MONOS) type as an example. However, the technique of the disclosure can be applied to any other memory cell MC of floating gate type and the like. The detailed structure of the MONOS type memory cell MC will be described in FIGS. 3A to 3D.

Further, the memory cell array 21 includes a plurality of memory gate lines MGL, a plurality of control gate lines CGL, and a plurality of source lines SL which are provided correspondingly to the respective rows of the plural memory cells MC and a plurality of bit lines BL which are provided correspondingly to the respective columns of the plural memory cells MC, as the control signal lines of the memory cells MC. FIG. 2 typically shows the control signal lines coupled to the one memory cell MC.

The CG driver circuit 22 includes a plurality of gate drivers for driving the control gate lines CGL by generating control gate (CG) signals.

The MG driver circuit 23 includes a plurality of gate drivers for driving the memory gate lines MGL by generating memory gate (MG) signals.

The boosting circuit 26 contains a charge pump circuit, to generate various sizes of boosting voltages and supply the above to the high voltage decode circuit 24. Specifically, the boosting circuit 26 generates a positive voltage VPPA for writing MG, a positive voltage VPPC for writing non-selected MG, a positive voltage VPPB for writing SL, a withstand voltage relaxing positive voltage VPPR, negative voltage VEEM for erasure MG, a negative voltage VEEV for erasure verifying MG, and a high voltage switch controlling negative voltage VEES.

Hereinafter, the positive voltage VPPA for writing MG is referred to as a high power source voltage VPPA, the positive voltage VPPC for writing non-selected MG is referred to as an intermediate voltage VPPC, and the withstand voltage relaxing positive voltage VPPR is referred to as an intermediate voltage VPPR in some cases. Each of the intermediate voltage VPPC and the intermediate voltage VPPR is the voltage value in the middle of the high power source voltage VPPA and the ground voltage VSS. In the following embodiment, the intermediate voltage VPPR is set at the voltage value in the middle of the high power source voltage VPPA and the intermediate voltage VPPC.

The high voltage switch circuit 25 generates voltages by selecting various kinds of boosting voltages generated by the boosting circuit 26.

Specifically, the high voltage switch circuit 25 generates voltage VMGPP, voltage VMGPN, voltage VMGNP, voltage VMGNN, voltage VMGBPP, voltage VMGBPN, voltage VMGBNP, voltage VMGBNN, voltage VSLP, and voltage VSLN.

The high voltage switch circuit 25 supplies the generated voltages to the high voltage decode circuit 24 as a power source voltage for decoder.

The high voltage decode circuit 24 supplies high voltages to the MG driver circuit 23 and the source line SL. More specifically, the high voltage decode circuit 24 uses the power source voltages for decoder generated by the high voltage switch circuit 25, supplies the decode signals to the MG driver circuit 23, and generates a source line signal to be supplied to each source line SL.

The sense amplifier/writing control circuit 27 reads out the stored contents of the selected memory cell through the bit line BL and writes the stored contents in the selected memory cell through the bit line BL.

[Supply Voltage to Memory Cell]

Next, a description will be made about an example of each voltage to be supplied from the CG driver circuit 22, the MG driver circuit 23, the high voltage decode circuit 24, and the sense amplifier/writing control circuit 27 to the selected/non-selected memory cell in the selected/non-selected block.

The values shown in FIGS. 3A to 3D and FIGS. 4A to 4D are only one example for the description and the values are not to be restricted to those values.

(Example of Voltage Supplied to Memory Cell in Data Writing)

FIGS. 3A to 3D are views each showing an example of the voltage to be applied to the memory cell in data writing, in a table form.

Figure 3A:
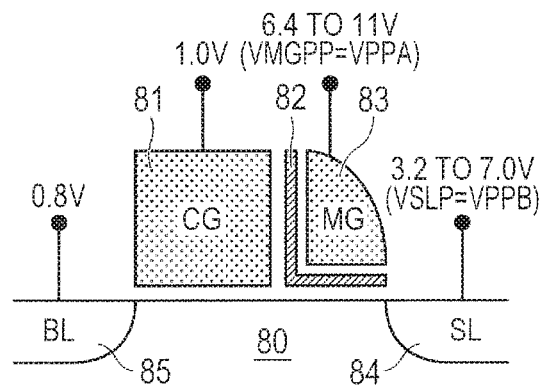
FIGS. 3A, 3B, 3C, and 3D are views each showing an example of a voltage applied to a memory cell in a data writing mode in a table form.

At first, with reference to FIG. 3A, a structure of the MONOS type non-volatile memory cell MC will be briefly described. The memory cell MC includes a control gate (CG) 81, a nitride silicon film 82, a memory gate (MG) 83, a source 84, and a drain 85. The control gate 81 is formed on the surface of the P type silicon substrate 80 through an insulating layer (not illustrated). The nitride silicon film 82 is formed on a side wall of the control gate 81 as the Oxide-Nitride-Oxide (ONO) film including a silicon oxide film (not illustrated), a nitride silicon film 82, and a silicon oxide film (not illustrated). The memory gate 83 of a side wall structure is formed on the ONO film. The source 84 and the drain 85 are respectively formed on the both sides of the control gate 81 and memory gate 83 by injecting N type dopant. The source 84 is coupled to the corresponding source line SL and the drain 85 is coupled to the corresponding bit line BL.

Next, the voltage applied to the memory cell MC in data writing will be described. Since the electrode having such a high voltage as requiring withstand voltage relaxing is the memory gate MG, the applied voltage of the memory gate MG will be noted hereinafter.

With respect to the selected memory cell in the selected block shown in FIG. 3A, the voltage VMGPP is applied to the selected memory gate MG. In the writing mode, the voltage VPPA is selected as the voltage VMGPP. As one example, the voltage VPPA becomes a voltage of about 6.4 to 11 [V].

Figure 3B:
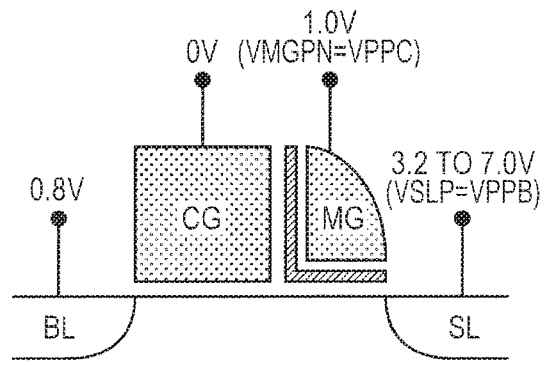

With respect to the non-selected memory cell in the selected block shown in FIG. 3B, the voltage VMGPN is applied to the non-selected memory gate MG. In the writing mode, the voltage VPPC is selected as the voltage VMGPN. As one example, the voltage VPPC is a voltage of about 1.0 [V].

Figure 3C:
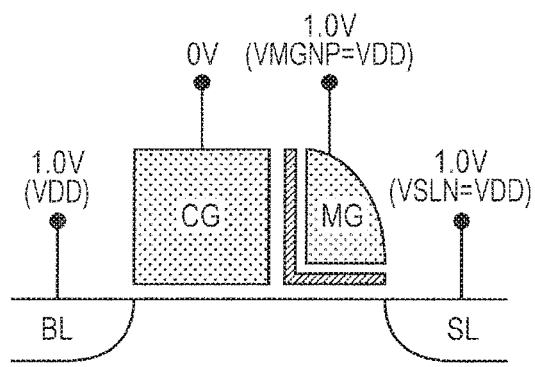

With respect to the selected memory cell in the non-selected block shown in FIG. 3C, the voltage VMGNP is applied to the selected memory gate MG. In the writing mode, the voltage VDD is selected as the voltage VMGNP. As one example, the voltage VDD is a voltage of about 1.0 [V].

Figure 3D:
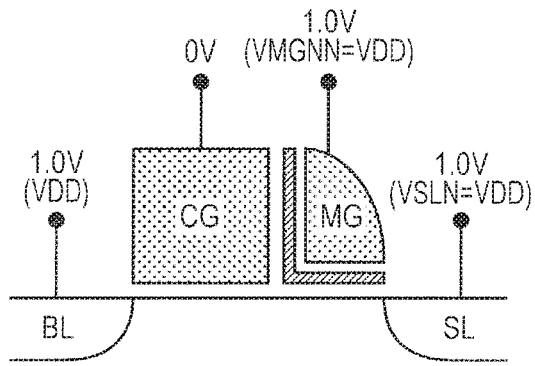

With respect to the non-selected memory cell in the non-selected block shown in FIG. 3D, the voltage VMGNN is applied to the non-selected memory gate MG. In the writing mode, the voltage VDD is selected as the voltage VMGNN. As one example, the voltage VDD is a voltage of about 1.0 [V].

(Example of Voltage Applied to Memory Cell in Data Erasing)

FIGS. 4A to 4D are views each showing an example of the voltage applied to the memory cell in data erasing, in a table form. Since the electrode having such a negative high voltage as requiring the withstand voltage relaxation is the memory gate MG, the applied voltage of the memory gate MG will be noted hereinafter.

Figure 4A:
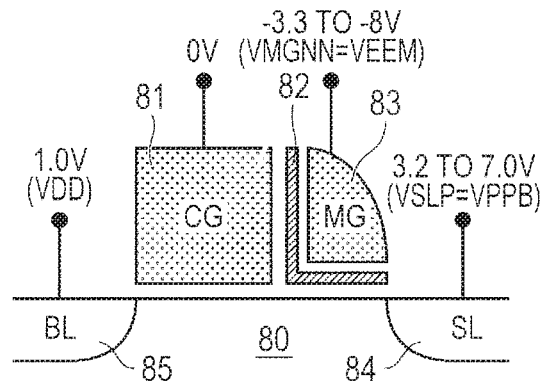
FIGS. 4A, 4B, 4C, and 4D are views each showing an example of the voltage applied to the memory cell in a data erasing mode in a table form.

With respect to the selected memory cell in the selected block shown in FIG. 4A, the voltage VMGNN is applied to the selected memory gate MG in the erasing mode. The voltage VEEM is selected as the voltage VMGNN in the erasing mode. As one example, the voltage VEEM is a voltage of about −3.3 to −8 [V].

Figure 4B:
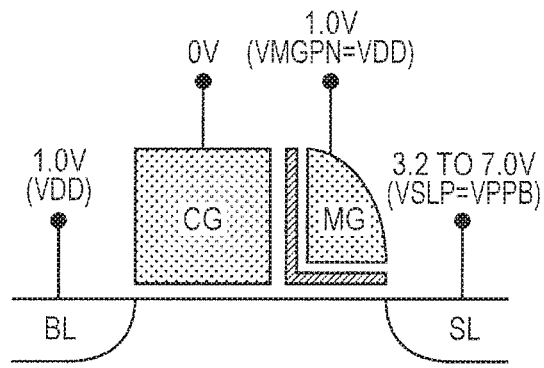

With respect to the non-selected memory cell in the selected block shown in FIG. 4B, the voltage VMGPN is applied to the non-selected memory gate MG in the erasing mode. The voltage VDD is selected as the voltage VMGPN in the erasing mode. As one example, the voltage VDD is a voltage of about 1.0 [V].

Figure 4C:
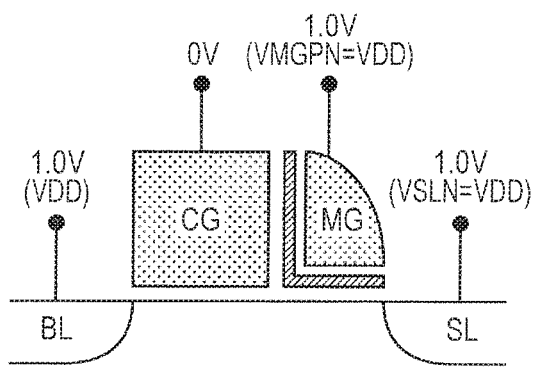

With respect to the selected memory cell in the non-selected block shown in FIG. 4C, the voltage VMGPN is applied to the selected memory gate MG in the erasing mode. The voltage VDD is selected as the voltage VMGPN in the erasing mode. As one example, the voltage VDD is a voltage of about 1.0 [V].

Figure 4D:
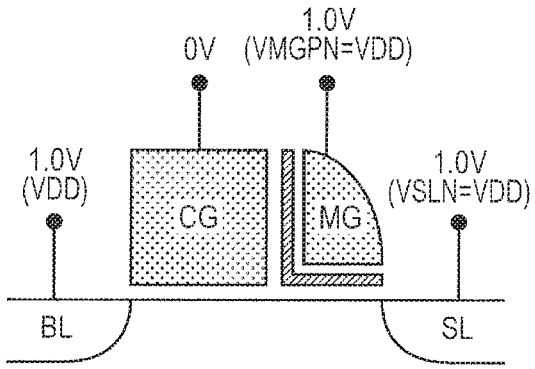

With respect to the non-selected memory cell in the non-selected block shown in FIG. 4D, the voltage VMGPN is applied to the non-selected memory gate MG in the erasing mode. The voltage VDD is selected as the voltage VMGPN in the erasing mode. As one example, the voltage VDD is a voltage of about 1.0 [V].

[High Voltage Switch Circuit]

FIGS. 5A to 5D are views each showing a concrete structure example of the high voltage switch circuit in FIG. 2.

Figure 5A:
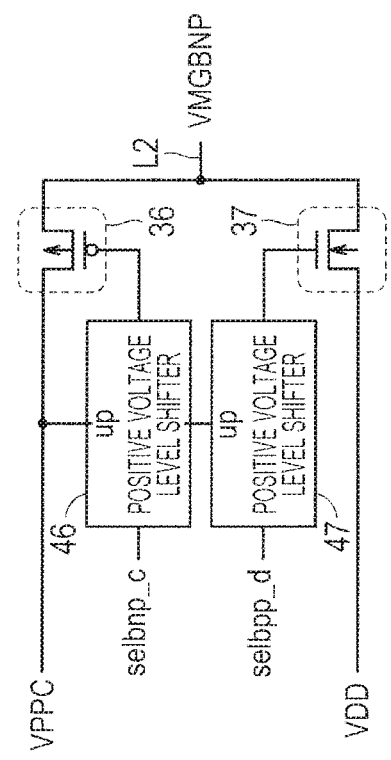
FIGS. 5A, 5B, 5C, and 5D are views each showing a concrete structural example of a high voltage switch circuit in FIG. 2.

FIG. 5A shows a circuit of generating a voltage VMGBPP. The voltage control line L0 supplies the voltage VMGBPP.

The voltage VPPA is supplied to the voltage control line L0 via the switch 31 and the voltage VDD is supplied there via the switch 32.

According to the operation mode, one of the voltage VPPA and the voltage VDD is selected and supplied to the voltage control line L0 as the voltage VMGBPP.

As the switch 31, the PMOS transistor of one stage and more is used. As the switch 32, the N-channel MOS transistor of one stage and more is used. In FIG. 5A, the switches 31 and 32 are shown as the MOS transistors of one stage, for simplification; if necessary for the withstand pressure, however, the MOS transistor of several stages may be used and a withstand voltage relaxing MOS transistor may be inserted. Similarly, if necessary for the withstand pressure, the MOS transistor of several stages may be used for the switches 33 to 40 described later and the withstand voltage relaxing MOS transistor may be inserted there.

The select signals selbpp_a and selbpp_d are the select signals of the VDD level for selecting the voltage VPPA and VDD respectively.

The select signals selbpp_a and selbpp_d are converted into the VPPA/VDD level by the positive voltage level shifters 41 and 42 respectively.

Figure 5C:
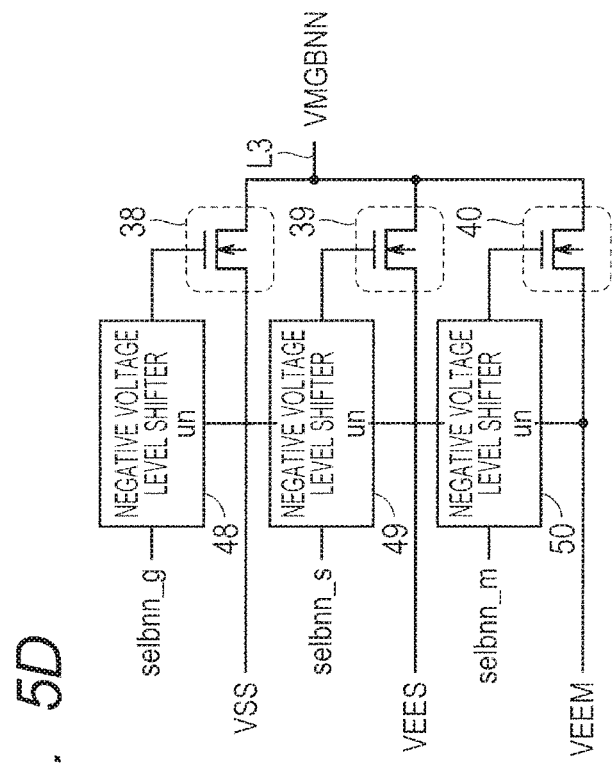
Figure 5B:
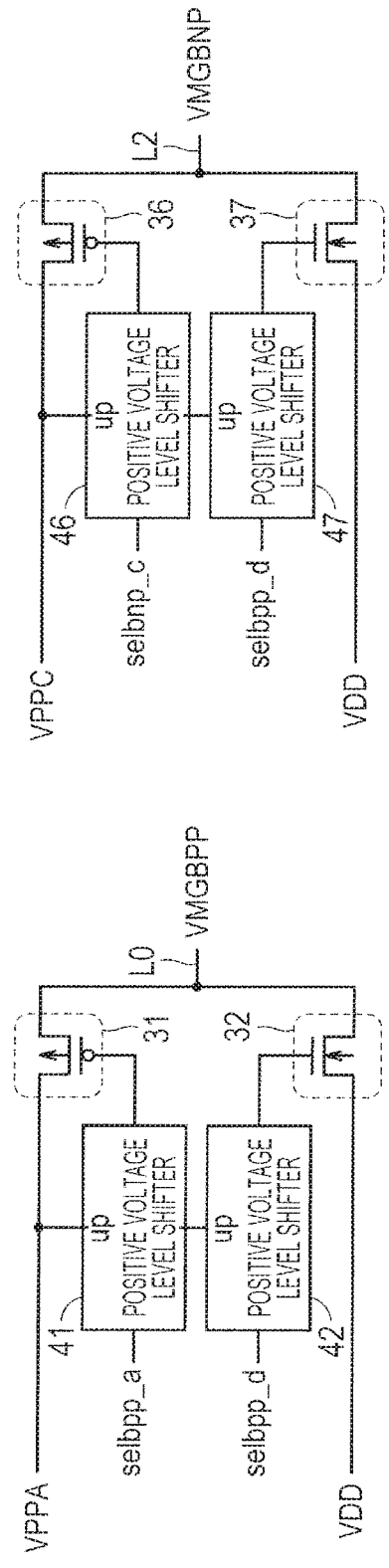

FIG. 5B shows a circuit of generating a voltage VMGBPN. The voltage control line L1 supplies the voltage VMGBPN.

The voltage VPPC is supplied to the voltage control line L1 via the switch 33, the voltage VSS is supplied there via the switch 34, and the voltage VEEM is supplied there via the switch 35.

According to the operation mode, one of the voltages VPPC, VSS, and VEEM is selected and supplied to the voltage control line L1 as the voltage VMGBPN.

As the switch 33, the PMOS transistor of one stage and more is used. As the switches 34 and 35, the N-channel MOS transistor of one stage and more is used.

The select signals selbpn_c, selbpn_g, and selbpn_s are the select signals of the VDD level for selecting the voltage VPPC, VSS, and VEEM respectively.

The select signal selbpn_c is converted into the VPPC/VDD level by the positive voltage level shifter 43.

The select signals selbpn_g and selbpn_s are converted into the VCC/VEEM level by the negative voltage level shifters 44 and 45 respectively.

At this point, in the switch 34, the positive power source of the negative voltage level shifter requires a voltage higher than the voltage VDD, for example, the voltage VCC, because the gate level of the voltage VDD is too low to pass the voltage VSS.

FIG. 5C shows a circuit of generating a voltage VMGBNP. The voltage control line L2 supplies the voltage VMGBNP.

The voltage VPPC is supplied to the voltage control line L2 via the switch 36, and the voltage VDD is supplied there via the switch 37.

As the switch 36, the PMOS transistor of one stage and more is used. As the switch 37, the N-channel MOS transistor of one stage and more is used.

According to the operation mode, one of the voltages VPPC and VDD is selected and supplied to the voltage control line L2 as the voltage VMGBNP.

The select signal selbnp_c and the select signal selbpp_d are the select signals of the VDD level for selecting the voltage VPPC and the voltage VDD respectively.

The select signals selbnp_c and selbpp_d are converted into the VPPC/VDD level by the positive voltage level shifters 46 and 47 respectively.

Figure 5D:
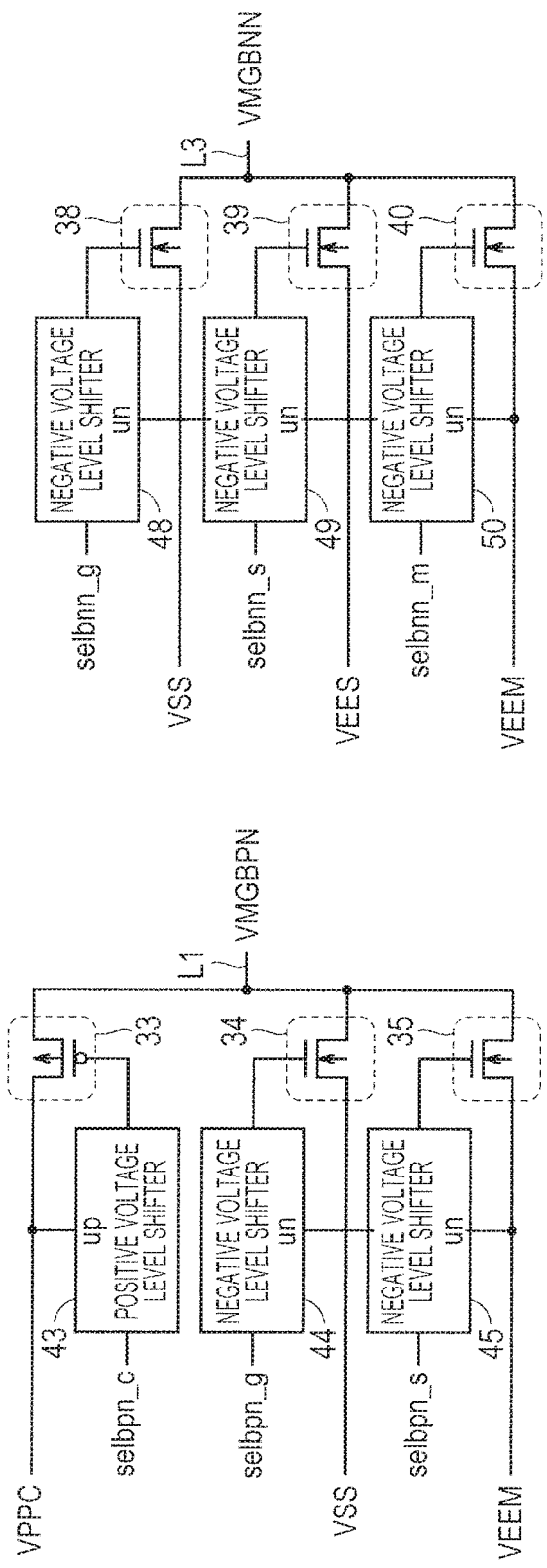

FIG. 5D shows a circuit of generating a voltage VMGBNN. The voltage control line L3 supplies the voltage VMGBNN.

The voltage VSS is supplied to the voltage control line L3 via the switch 38, the voltage VEES is supplied there via the switch 39, and the voltage VEEM is supplied there via the switch 40.

According to the operation mode, one of the voltages VSS, VEES, and VEEM is selected and supplied to the voltage control line L3 as the voltage VMGBNN.

As the switches 38 to 40, the NMOS transistor of one stage and more is used. The select signals selbnn_g, selbnn_s, and selbnn_m are the select signals of the VDD level for selecting the voltage VSS, VEES, and VEEM respectively.

The select signals selbnn_g, selbnn_s, and selbnn_m are converted into the VCC/VEEM level by the negative voltage level shifters 48, 49, and 50 respectively.

Figure 6A:
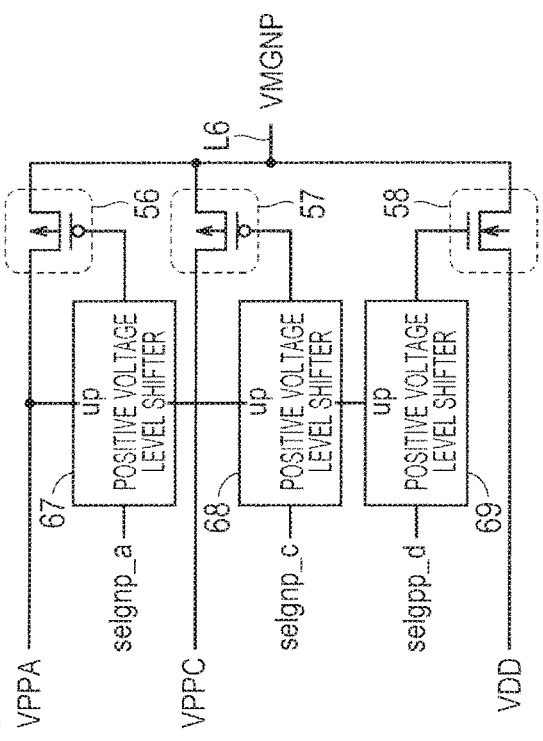
FIGS. 6A, 6B, 6C, and 6D are views each showing another concrete structural example of the high voltage switch circuit in FIG. 2.

FIGS. 6A to 6D are views each showing another concrete example of the high voltage switch circuit in FIG. 2. FIG. 6A shows a circuit of generating a voltage VMGPP.

The voltage control line L4 supplies the voltage VMGPP. The voltage VPPA is supplied to the voltage control line L4 via the switch 51 and the voltage VDD is supplied there via the switch 52.

According to the operation mode, one of the voltages VPPA and VDD is selected and supplied to the voltage control line L4 as the voltage VMGPP.

The select signal selgpp_a and the selgpp_d are the select signals of the VDD level for selecting the voltage VPPA and the voltage VDD respectively.

The select signals selgppa and selgppd are converted into the VPPA/VDD level by the positive voltage level shifters 62 and 63 respectively.

Figure 6C:
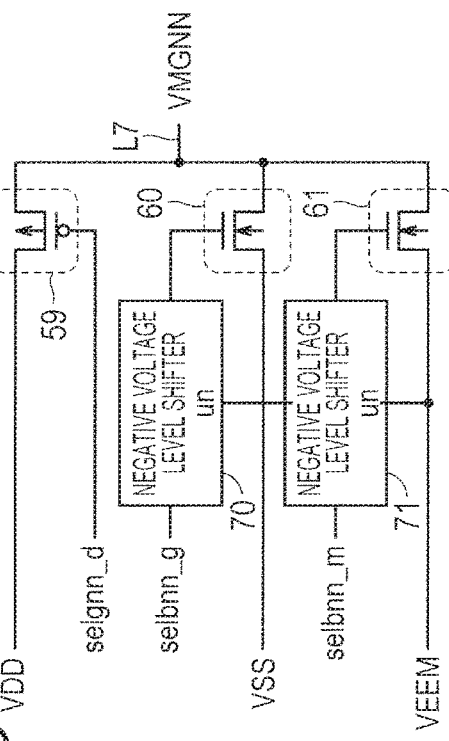
Figure 6B:
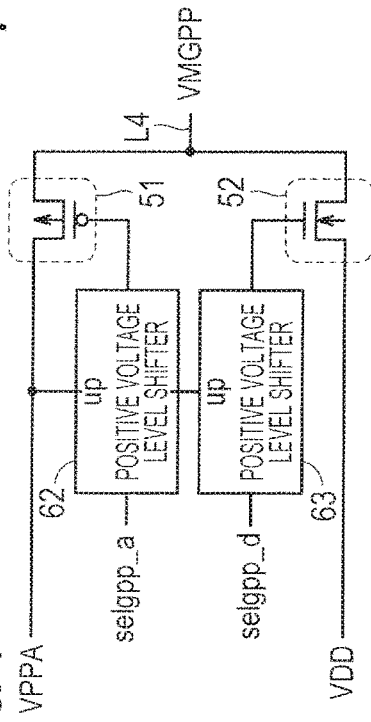

FIG. 6B shows a circuit of generating a voltage VMGPN. The voltage control line L5 supplies the voltage VMGPN.

The voltage VPPC is supplied to the voltage control line L5 via the switch 53, the voltage VSS is supplied there via the switch 54, and the voltage VEES is supplied there via the switch 55.

According to the operation mode, one of the voltages VPPC, VSS, and VEES is selected and supplied to the voltage control line L5 as the voltage VMGPN.

The select signals selgpn_c, selgpn_g, and selgpn_s are the select signals of the VDD level for selecting the voltage VPPC, VSS, and VEES respectively.

The select signal selgpn_c is converted into the VPPC/VDD level by the positive voltage level shifter 64 and the select signals selgpn_g and selgpn_s are converted into the VCC/VEES level by the negative voltage level shifters 65 and 66 respectively.

FIG. 6C shows a circuit of generating a voltage VMGNP. The voltage control line L6 supplies the voltage VMGNP.

The voltage VPPA is supplied to the voltage control line L6 via the switch 56, the voltage VPPC is supplied there via the switch 57, and the voltage VDD is supplied there via the switch 58.

According to the operation mode, one of the voltages VPPA, VPPC, and VDD is selected and supplied to the voltage control line L6 as the voltage VMGNP.

The select signals selgnp_a, selgnp_c, and selgnp_d are the select signals of the VDD level for selecting the voltage VPPA, VPPC, and VDD respectively.

The select signals selgnp_a, selgnp_c, and selgnp_d are converted into the VPPA/VDD level by the positive voltage level shifters 67, 68, and 69 respectively.

Figure 6D:
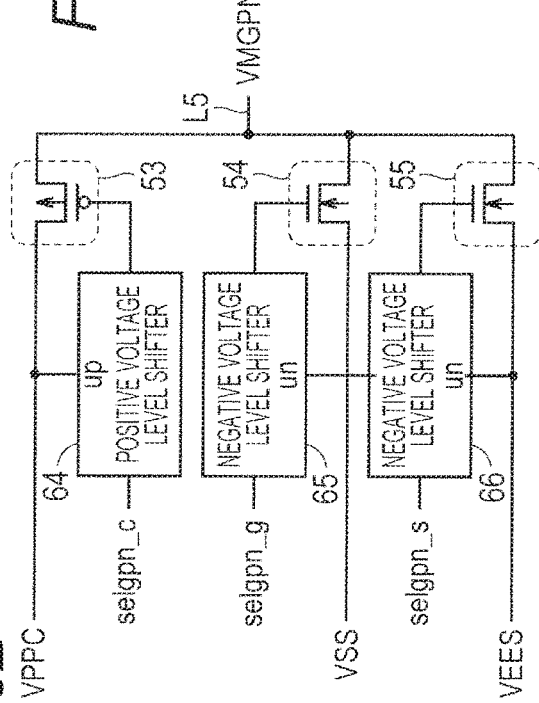

FIG. 6D shows a circuit of generating a voltage VMGNN. The voltage control line L7 supplies the voltage VMGNN.

The voltage VDD is supplied to the voltage control line L7 via the switch 59, the voltage VSS is supplied there via the switch 60, and the voltage VEEM is supplied there via the switch 61.

According to the operation mode, one of the voltages VDD, VSS, and VEEM is selected and supplied to the voltage control line L7 as the voltage VMGNN.

The select signals selgnn_d, selgnn_g, and selgnn_m are the select signals of the VDD level for selecting the voltage VDD, VSS, and VEEM respectively.

The select signals selgnn_g and selgnn_m are converted into the VCC/VEEM level by the negative voltage level shifters 70 and 71.

The select signal selgnn_d, having the VDD/VSS level, can be used as it is. FIG. 7 is a view for use in describing the selected state of the boosting power source in the writing and erasing mode of the high voltage switch circuit.

With reference to FIG. 7, the mode of switching the voltage to be generated between the writing state and the erasing state is described.

The voltage VMGBPP is switched between the voltage VPPA and the voltage VDD. The voltage VMGBPN is switched among the voltages VPPC, VSS, and VEES.

The voltage VMGBNP is switched between the voltages VPPC and VDD. The voltage VMGBNN is switched among the voltages VSS, VEES, and VEEM.

The voltage VMGPP is switched between the voltages VPPA and VDD. The voltage VMGPN is switched among the voltages VPPC, VSS, and VEES.

The voltage VMGNP is switched among the voltages VPPA, VPPC, and VDD. The voltage VMGNN is switched among the voltages VDD, VSS, and VEEM.

Although some additional switch may be possibly provided to cope with a verify mode and a test mode, it is omitted here.

Figure 8:
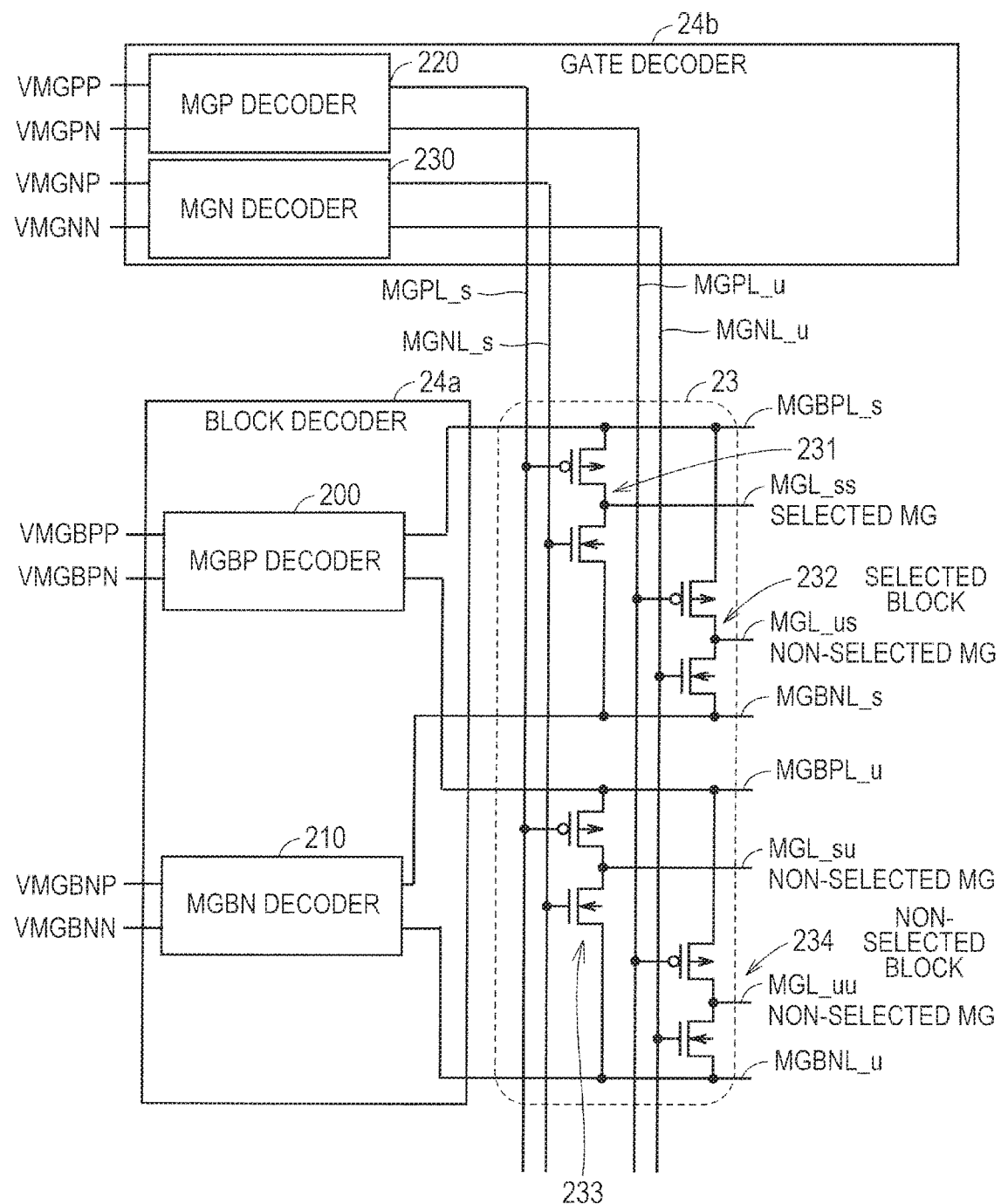
FIG. 8 is a view for use in describing the detailed structure of a high voltage decode circuit 24 and an MG driver circuit 23.

FIG. 8 is a view for use in describing the detailed structure of the high voltage decode circuit 24 and the MG driver circuit 23.

With reference to FIG. 8, the high voltage decode circuit 24 includes a block decoder 24a of generating a source potential for the driver transistor in the MG driver circuit 23 and a gate decoder 24b of generating a gate potential for the driver transistor in the MG driver circuit 23.

In this example, the case of having each one of the selected block/non-selected block typically is described.

The MG driver circuit 23 includes the gate drivers 231 to 234 that drive the memory gate lines MGL_ss, MGL_us, MGL_su, and MGL_uu.

The memory gate line MGL_ss is coupled to the memory gate of the selected block. The memory gate line MGL_us is coupled to the non-selected memory gate in the selected block.

The memory gate line MGL_su is coupled to the non-selected memory gate in the non-selected block. The memory gate line MGL_uu is coupled to the non-selected memory gate in the non-selected block.

Each of the gate drivers 231 to 234 includes the P-channel MOS transistor and the N-channel MOS transistor.

The P-channel MOS transistor of the gate driver 231 is provided between the voltage control line MGBPL_s and the memory gate line MGL_ss, and its gate is coupled to the voltage control line MGPL_s.

The N-channel MOS transistor of gate driver 231 is provided between the memory gate line MGL_ss and the voltage control line MGBNL_s, and its gate is coupled to the voltage control line MGNL_s.

The P-channel MOS transistor of the gate driver 232 is provided between the voltage control line MGBPL_s and the memory gate line MGL_us, and its gate is coupled to the voltage control line MGPL_u.

The N-channel MOS transistor of the gate driver 232 is provided between the memory gate line MGL_us and the voltage control line MGBNL_s, and its gate is coupled to the voltage control line MGNL_u.

The P-channel MOS transistor of the gate driver 233 is provided between the voltage control line MGBPL_u and the memory gate line MGL_su, and its gate is coupled to the voltage control line MGPL_s.

The N-channel MOS transistor of the gate driver 233 is proved between the memory gate line MGL_su and voltage control line MGBNL_u, its gate is coupled to the voltage control line MGNL_s.

The P-channel MOS transistor of the gate driver 234 is provided between the voltage control line MGBPL_u and the memory gate line MGL_uu, and its gate is coupled to the voltage control line MGPL_u.

The N-channel MOS transistor of the gate driver 234 is provided between the memory gate line MGL_uu and voltage control line MGBNL_u, and its gate is coupled to the voltage control line MGNL_u.

The voltage control lines MGPL_s, MGNL_s, MGPL_u, and MGNL_u are provided in common in the selected block and the non-selected block, with respect to the same column.

Upon receipt of the voltages VMGBPP, VMGBPN, VMGBNP, and VMGBNN, the block decoder 24a drives the voltage control lines MGBPL_s, MGBNL_s, MGBPLv_u, and MGBNL_u respectively.

The block decoder 24a includes the MGBP decoder 200 and the MGBN decoder 210.

Upon receipt of the voltages VMGBPP and VMGBPN, the GBP decoder 200 drives the voltage control lines MGBPL_s and MGBPL_u.

Upon receipt of the voltages VMGBNP and VMGBNN, the MGBN decoder 210 drives the voltage control lines MGBNL_s and MGBNL_u.

Upon receipt of the voltages VMGBPP, VMGBPN, VMGBNP, and VMGBNN, the gate decoder 24b drives the voltage control lines MGPL_s, MGL_s, MGPL_u, and MGNL_u respectively.

The gate decoder 24b includes the MGP decoder 220 and the MGN decoder 230. Upon receipt of the voltages VMGPP and VMGPN, the MGP decoder 220 drives the voltage control lines MGPL_s and MGPL_u.

Upon receipt of the voltages VMGNP and VMGNN, the MGN decoder 230 drives the voltage control lines MGNL_s and MGNL_u.

In FIG. 8, the gate decoder 24b is described separately as the MGP decoder 220 for the gates of the P-channel MOS transistors in the MG driver circuit 23 and the MGN decoder 230 for the gates of the N-channel MOS transistors in the MG driver circuit 23, considering the withstand voltage relaxation in the MG driver circuit 23. When the MG driver circuit 23 has a tolerance in the withstand voltage, the decoder for the P-channel MOS transistor gates and the decoder for the N-channel MOS transistor gates can be replaced with the common gate decoder as the gate decoder 24b.

In this case, the voltage control lines MGPL_s and MGPL_u can be replaced with the common voltage control line, and the voltage control lines MGNL_s and MGNL_u can be replaced with the common voltage control line.

Figure 9:
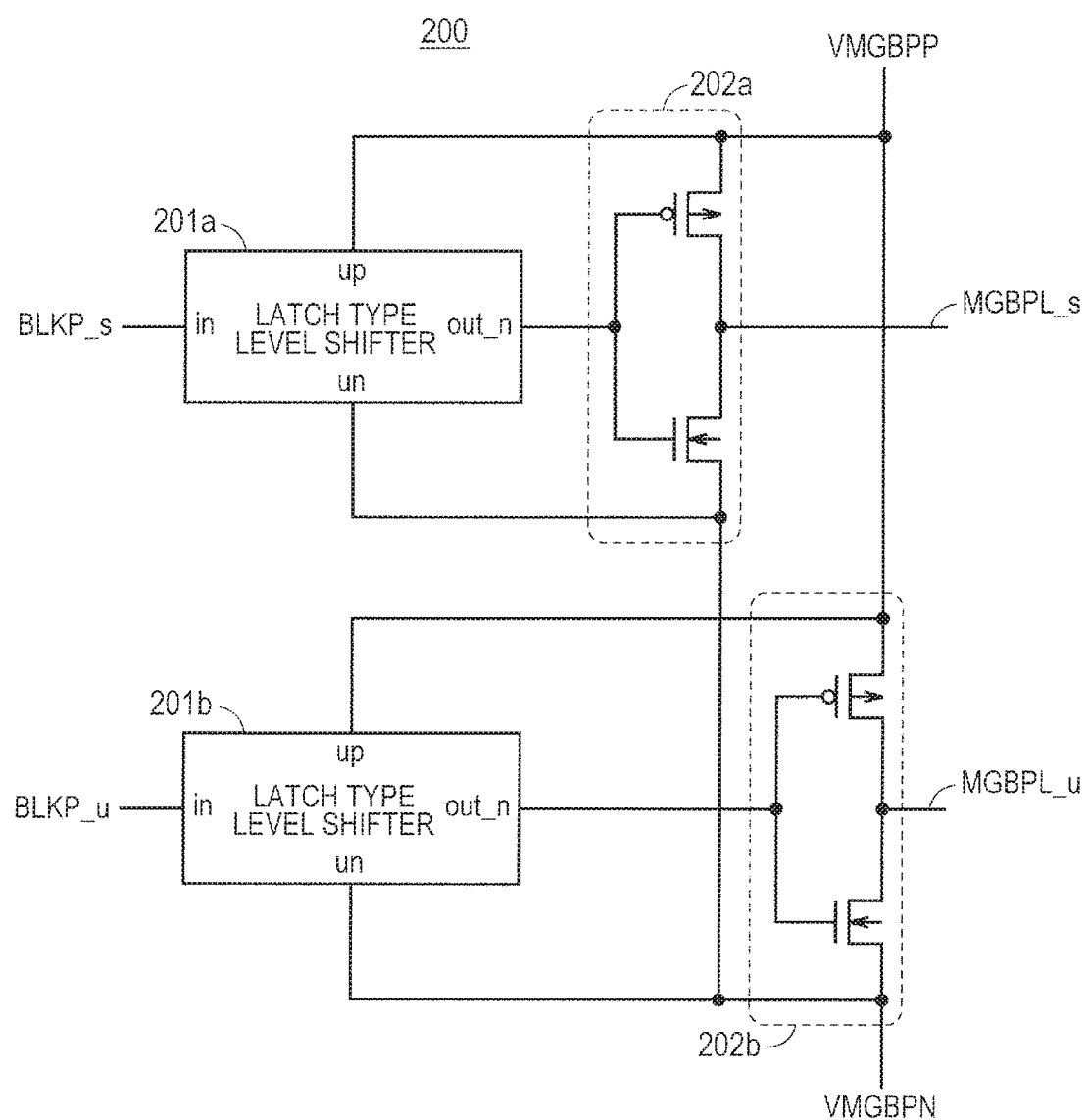

FIG. 9 is a view for use in describing a structure of the MGBP decoder 200 that drives the voltage control lines at a high potential side in the block decoder 24a.

With reference to FIG. 9, the MGBP decoder 200 includes a driver circuit 202a of driving the voltage control line MGBPL_s, a driver circuit 202b of driving the voltage control line MGBPL_u, a latch type level shifter 201a of controlling the driver circuit 202a, and a latch type level shifter 201b of controlling the driver circuit 202b.

The driver circuits 202a and 202b and the latch type level shifters 201a and 201b receive the voltages VMGBPP and VMGBPN as the voltages at the high potential side and the low potential side.

The latch type level shifters 201a and 201b receive the block select signals. The above shifters receive the block select signals BLKP_s and BLKP_u of the VDD level as the control signals.

The block select signals are input for the number of the blocks. In the example, the case of providing two blocks as an example of a plurality of blocks is shown and the case of providing each one of the selected block/non-selected block typically is described.

In the example, the block select signal BLKP_s is set at "H" level. The block select signal BLKP_u is set at "L" level.

The block select signals BLKP_s and BLKP_u are to control all-selected/none-selected individually and they are not necessarily the same signal.

The block select signal BLKP_s is converted from the VDD/VSS level into the voltage VMGBPP/VMGBPN level by the latch type level shifter 201a.

The block select signal BLKP_u is converted from the VDD/VSS level into the voltage VMGBPP/VMGBPN level by the latch type level shifter 201b.

The driver circuits 202a and 202b drive the voltage control lines MGBPL_s and MGBPL_u according to the signals converted by the latch type level shifters 201a and 201b.

Figure 10:
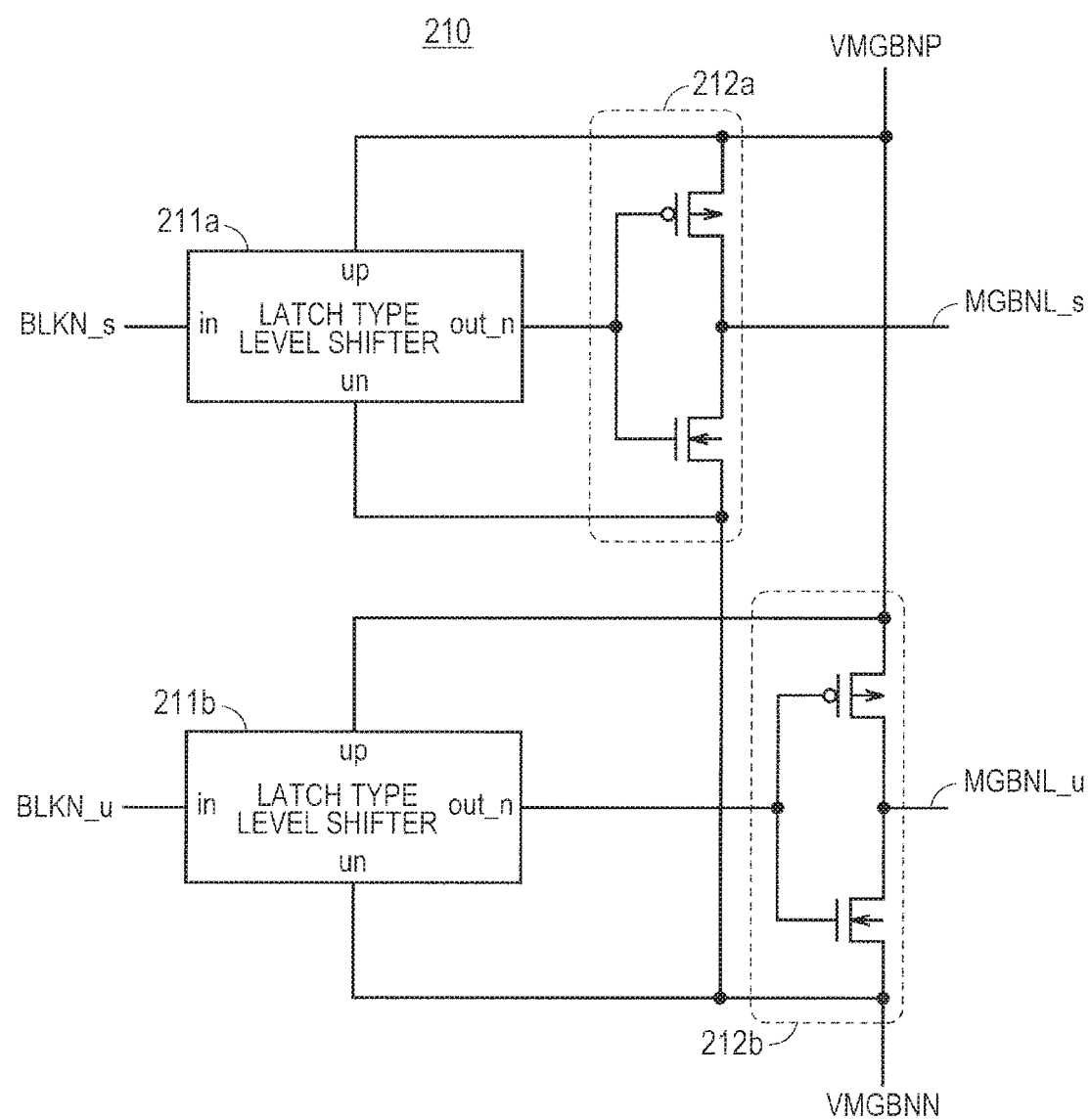

FIG. 10 is a view for use in describing a structure of the MGBN decoder that drives the voltage control lines at the low potential side in the block decoder 24a.

With reference to FIG. 10, the MGBN decoder includes a driver circuit 212a of driving the voltage control line MGBNL_s, a driver circuit 212b of driving the voltage control line MGBNL_u, a latch type level shifter 211a of controlling the driver circuit 212a, and a latch type level shifter 211b of controlling the driver circuit 212b.

The driver circuits 212a and 212b and the latch type level shifters 211a and 211b receive the voltages VMGBNP and VMGBNN as the voltages at the high potential side and the low potential side.

The block select signal is input to the latch type level shifters 211a and 211b. The control signal BLKN_s and BLKN_u of the VDD level are input as the block select signal.

The block select signals are input for the number of the blocks. In this example, the case of providing the two blocks as the several blocks is shown and the case of providing each one of the selected block/non-selected block typically is described.

In the example, the block select signal BLKN_s is set at the "H" level. The block select signal BLKN_u is set at the "L" level.

The control signals BLKN_s and BLKN_u are to control all-select/none-select individually and they are not the same signal.

The block select signal BLKN_s is converted from the VDD/VSS level into the voltage VMGBNP/VMGBNN level by the latch type level shifter 211a.

The block select signal BLKN_u is converted from the VDD/VSS level into the voltages VMGBNP/VMGBNN level by the latch type level shifter 211b.

The driver circuits 212a and 212b drive the voltage control lines MGBNL_s and MGBNL_u according to the signals converted by the latch type level shifters 211a and 211b.

Figure 11:
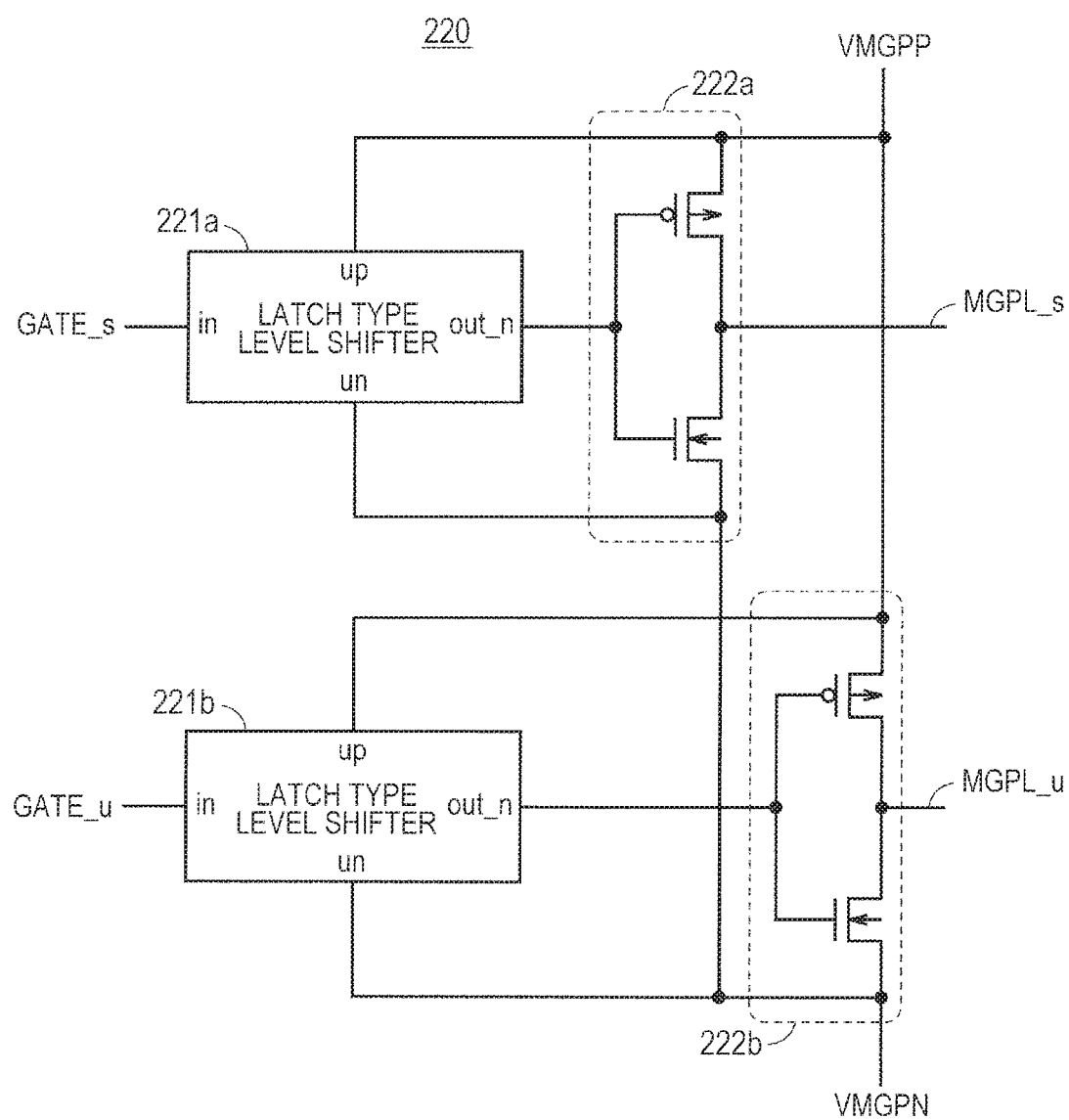
FIG. 11 is a view for use in describing a structure of an MGP decoder that drives the voltage control line in the gate decoder 24b.

FIG. 11 is a view for use in describing a structure of the MGP decoder that drives the voltage control lines in the gate decoder 24b.

With reference to FIG. 11, the MGP decoder includes a driver circuit 222a that drives the voltage control line MGPL_s, a driver circuit 222b that drives the voltage control line MGPL_u, a latch type level shifter 221a that controls the driver circuit 222a, and a latch type level shifter 221b that controls the driver circuit 222b.

The driver circuits 222a and 222b and the latch type level shifters 221a and 221b receive the voltages VMGPP and VMGPN as the voltages at the high potential side and the low potential side.

The latch type level shifters 221a and 221b receive the gate select signals. They receive the gate select signals GATE_s and GATE_u of the VDD level as the control signals.

The gate select signals are input for the number of the rows of the memory cells in each block. In the example, the case of providing two rows of the memory cells in each block is shown and the case of providing each one of the selected gate/non-selected gate typically is described.

In the example, the gate select signal GATE_s is set at the "H" level. The gate select signal GATE_u is set at the "L" level.

Here, the gate select signals GATE_s and GATE_u are to individually control the all-selected/none-selected and they are not necessarily the same signals.

The gate select signal GATE_s is converted from the VDD/VSS level into the voltages VMGPP/VMGPN level by the latch type level shifter 221a.

The gate select signal GATE_u is converted from the VDD/VSS level into the voltages VMGPP/VMGPN level by the latch type level shifter 221b.

The driver circuits 222a and 222b drive the voltage control lines MGPL_s and MGPL_u according the signals converted by the latch type level shifters 221a and 221b.

Figure 12:
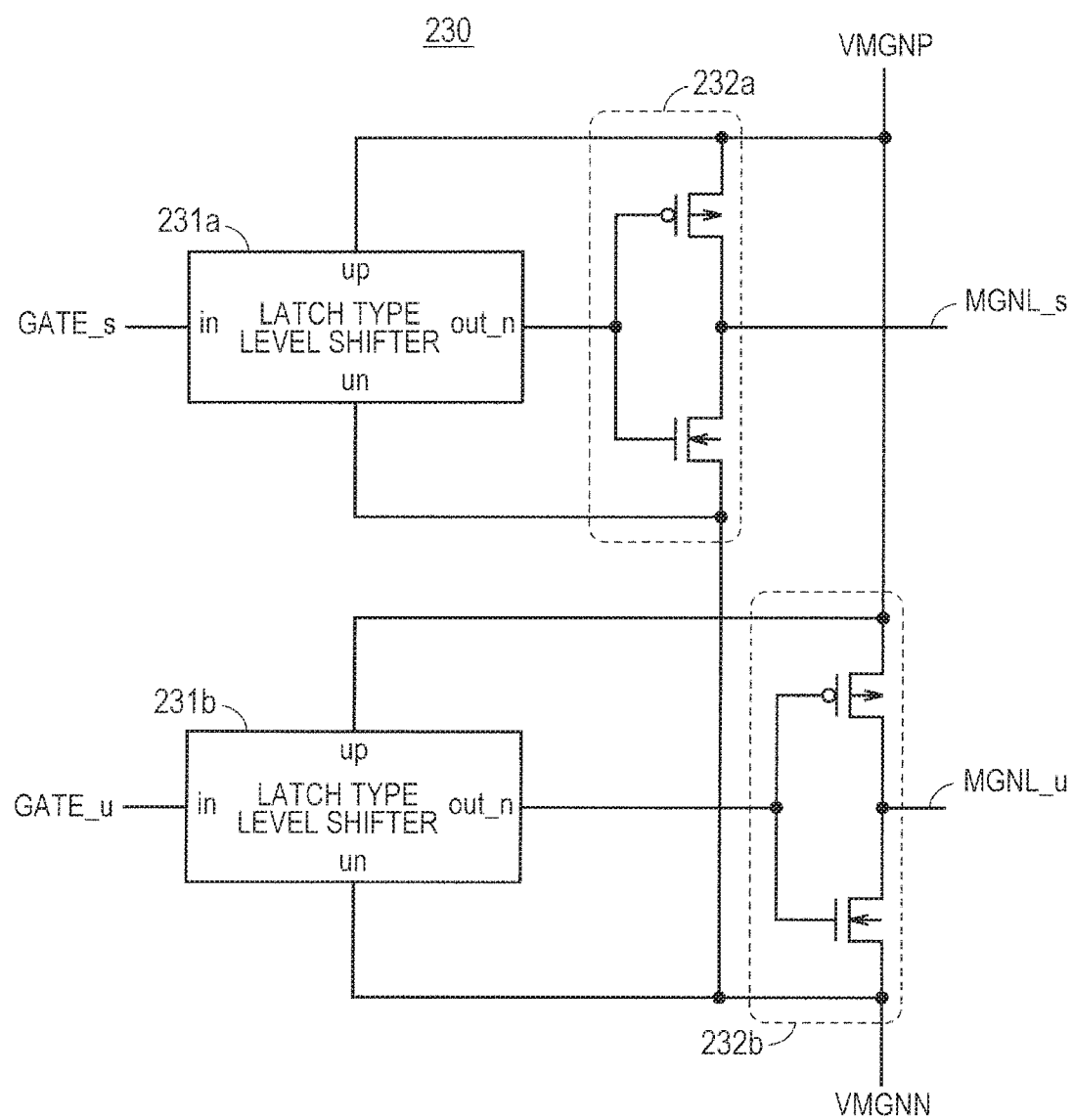
FIG. 12 is a view for use in describing a structure of an MGN decoder that drives the voltage control line in the gate decoder 24b.

FIG. 12 is a view for use in describing a structure of the MGN decoder which drives the voltage control lines in the gate decoder 24b.

With reference to FIG. 12, the MGN decoder includes a driver circuit 232a of driving the voltage control line MGNL_s, a driver circuit 232b of driving the voltage control line MGNL_u, a latch type level shifter 231a of controlling the driver circuit 232a, and a latch type level shifter 231b of controlling the driver circuit 232b.

The driver circuits 232a and 232b and the latch type level shifters 231a and 231b receive the voltages VMGNP and VMGNN as the voltages at the high potential side and the low potential side.

The latch type level shifters 231a and 231b receive the gate select signals. As the gate select signal, they receive the control signals GATE_s and GATE_u of the VDD level.

The gate select signals are input for the number of the rows of the memory cells in each block. In the example, the case of providing the two rows of the memory cells in each block is shown and the case of providing each one of the selected gate/non-selected gate typically is described.

In this example, the gate select signal GATE_s is set at the "H" level. The gate select signal GATE_u is set at the "L" level.

The gate select signals GATE_s and GATE_u are to individually control the all-selected/none-selected and they are not necessarily the same signals.

The gate select signal GATE_s is converted from the VDD/VSS level into the voltage VMGNP/VMGNN level by the latch type level shifter 231a.

The gate select signal GATE_u is converted from the VDD/VSS level into the voltage VMGNP/VMGNN level by the latch type level shifter 231b.

According to the signals converted by the latch type level shifters 231a and 231b, the driver circuits 232a and 232b drive the voltage control lines MGNL_s and MGNL_u.

Figure 13:
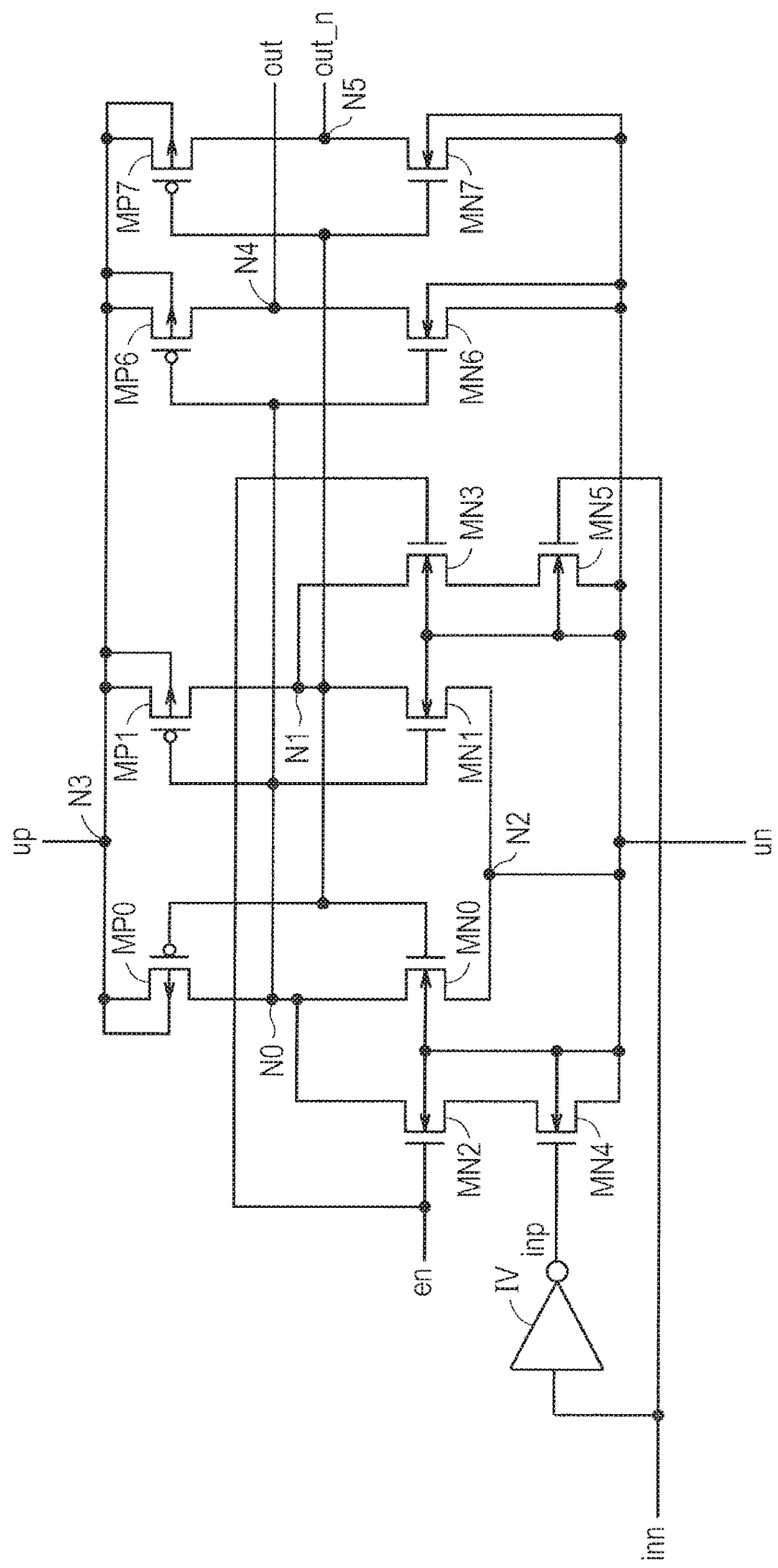
FIG. 13 is a circuit diagram for use in describing a structure of a latch type level shifter.

FIG. 13 is a circuit diagram for use in describing a structure of the latch type level shifter. Since the structure of each latch type level shifter is the same, the detailed description will not be repeated below.

The latch type level shifter includes the P-channel MOS transistors MP0, MP1, MP6, and MP7, the N-channel MOS transistors MN0 to M7, and the inverter IV.

The inverter IV outputs a signal inp obtained by inverting an input signal inn. The P-channel MOS transistor MP0 is provided between the node N3 and the node N0 and its gate is coupled to the node N1.

The P-channel MOS transistor MP1 is provided between the node N3 and the node N1 and its gate is coupled to the node N0.

The node N3 is coupled to a terminal up at a high potential side. The N-channel MOS transistors MN2 and MN4 are provided between the node N0 and the node N2 and their gates respectively receive the control signal en and the input signal inp.

The N-channel MOS transistor MN0 is provided between the node N0 and the node N2, in parallel with the N-channel MOS transistors MN2 and MN4 and its gate is coupled to the node N1.

The node N2 is coupled to a terminal un at a low potential side. The N-channel MOS transistors MN3 and MN5 are provided between the node N1 and the node N2 and the gates thereof respectively receive the control signal en and the input signal inn.

The N-channel MOS transistor MN1 is provided between the node N1 and the node N2 in parallel with the N-channel MOS transistors MN3 and MN5, and its gate is coupled to the node N0.

The P-channel MOS transistor MP6 and the N-channel MOS transistor MN6 are coupled in series between the node N3 and the node N2, and their gates are coupled to the node N0.

An output signal out is supplied from the connection node N4 of the P-channel MOS transistor MP6 and the N-channel MOS transistor MN6.

The P-channel MOS transistor MP7 and the N-channel MOS transistor MN7 are coupled in series between the node N3 and the node N2 and their gates are coupled to the node N1.

An output signal out_n is supplied from the connection node N5 of the P-channel MOS transistor MP7 and the N-channel MOS transistor MN7.

The input signal inn and the input signal inp are mutually complementary signals. For example, the case where the control signal en is the "H" level and the input signal inn is the "H" level is described. Here, the input signal inp is the "L" level.

In this state, the N-channel MOS transistors MN3 and MN5 become conductive. According to this, the node N1 is coupled to the voltage un.

On the other hand, according as the node N1 is set at the "L" level, the P-channel MOS transistor MP0 is turned on. According to this, the node N0 becomes the "H" level.

According as the nodes N0 and N1 become the "H" level and the "L" level, the N-channel MOS transistor MN6 and the P-channel MOS transistor MP7 are turned on. As the result, the output signals out and out_n are respectively set at the "L" level and the "H" level.

On the other hand, the case where the control signal en is the "H" level and the input signal inn is the "L" level is described. Here, the input signal inp is the "H" level.

In this state, the N-channel MOS transistors MN2 and MN4 become conductive. According to this, the node N0 is coupled to the voltage un.

When the node N0 is set at the "L" level, the P-channel MOS transistor MP1 is turned on. According to this, the node N1 becomes the "H" level.

When the nodes N0 and N1 become the "L" level and the "H" level, the P-channel MOS transistor MP6 and the N-channel MOS transistor MN7 are turned on. As the result, the output signals out and out_n are respectively set at the "H" level and the "L" level.

In the latch type level shifters of FIGS. 9 to 12, the control signal en is omitted. In the example, the case of combining the input signal with an inverter for complement is described. Further, the structure of supplying two output signals as the output signal is described; however, the side of not using may be in an open state.

FIG. 14 is a view for use in describing the state of the voltage control lines and the memory gate lines in the writing and erasing mode of the high voltage decoder circuit.

With reference to FIG. 14, the mode of switching the boosting voltage to be supplied to the voltage control line is described in the writing state and the erasing state.

Further, the voltage of the gate select line is switched by switching the voltage among the initial mode, the writing wait mode, the writing applied mode, the erasing wait mode, and the erasing applied mode.

More specifically, each voltage of the voltage control lines MGBPL_s, MGBPL_u, MGBNL_s, MGBNL_u, MGPL_s, MGPL_u, MGNL_s, and MGNL_u is switched in the initial mode, the writing wait mode, the writing applied mode, the erasing wait mode, and the erasing applied mode.

According to this, each voltage of the gate select lines MGL_ss, MGL_su, MGL_us, and MGL_uu is switched.

FIG. 15 is a view for use in describing an output example of the boosting voltage in each state, for realizing a bias state of the memory cell.

As shown in FIG. 15, the voltage level is switched among the voltages VPPA, VPPB, VPPC, VPPR, VEEM, VEEV, and VEES, according to each state.

Figure 16A:
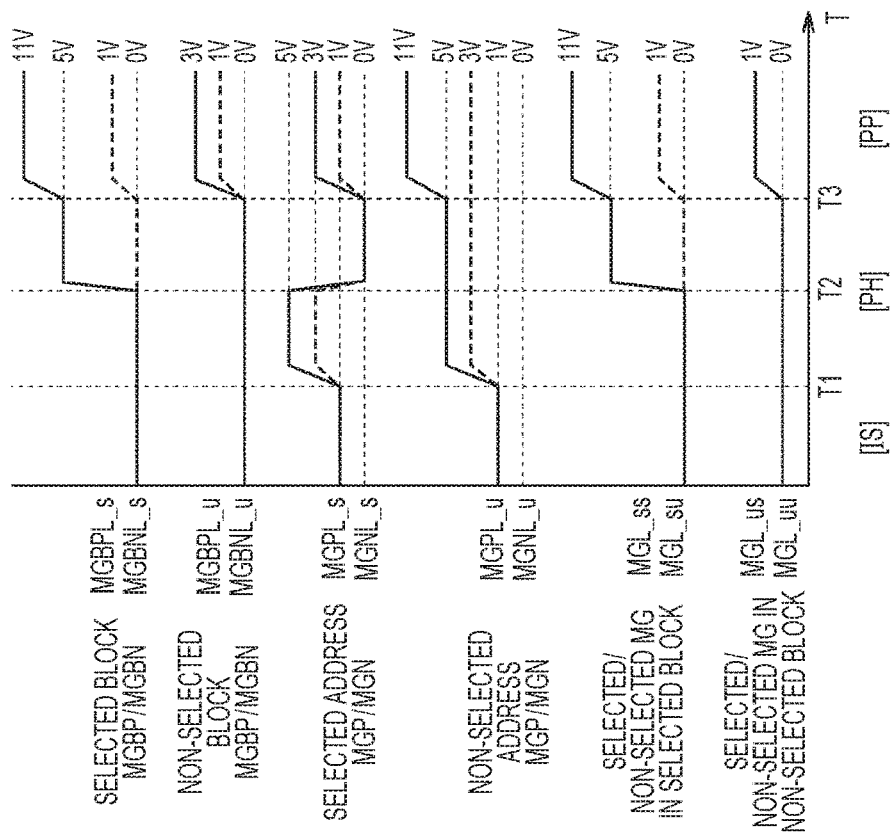
FIG. 16A and FIG. 16B are timing charts for use in describing the voltage and voltage control line in the writing mode.
Figure 16B:
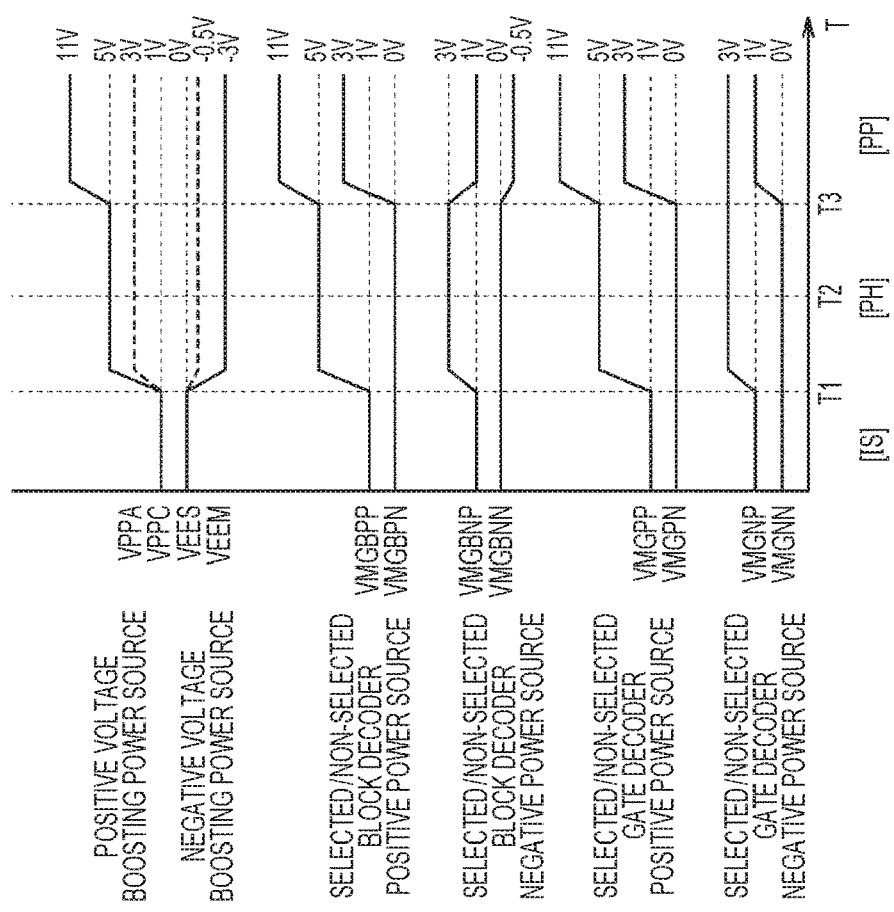

FIG. 16A and FIG. 16B are timing charts for use in describing the voltages and the voltage control lines in the writing mode.

With reference to FIGS. 16A and 16B, a symbol [IS] shows the initial state before starting the rewriting. A symbol [PH] shows the writing wait state before program pulse application. In short, it is in the middle state capable of switching the address input to the high voltage decode circuit 24. A symbol [PP] shows the writing applied state in the program pulse application time.

At the time T1, the state starts shifting from the [IS] to the [PH]. At the time T2, the address to apply pulse is selected and at the time T3, the state starts shifting from the [PH] to the [PP].

At first, in the [IS], the boosting voltage other than the voltage VPPR stops. It is set as the voltage VPPA=VPPC=VDD=1 V.

Further, it is set as the voltage VEEM=VEES=VSS=0 V. Here, the high voltage switch circuit 25 selects the voltage VMGBPP=voltage VPPA (1V), voltage VMGBPN=voltage VSS (0V), voltage VMGBNP=voltage VDD (1V), and voltage VMGBNN=voltage VSS (0 V) and supplies the above to the block decoder 24a.

The high voltage switch circuit 25 selects the voltage VMGPP=voltage VDD (1V), voltage VMGPN=voltage VSS (0 V), voltage VMGNP=voltage VDD (1V), and voltage VMGNN=voltage VSS (0 V) and outputs the above to the gate decoder 24b.

The high voltage decode circuit 24 sets as the voltage control line MGBPL_s=voltage VMGBPN (0 V), voltage control line MGBNL_s=voltage MGBNN (0 V), voltage control line MGPL_u=voltage VMGPP (1 V), and voltage control line MGNL_u=voltage VMGNP (1 V). Therefore, all the memory gates MG are none-selected state (0 V).

When the boosting voltage is activated at the time T1, the voltage VPPA changes from 1 V to 5 V, the voltage VPPC changes from 1 V to 3V, the voltage VEEM changes from 0 V to −3 V, and the voltage VEES changes from 0 V to −0.5 V.

At the same time, switching is performed in the high voltage switch circuit 25, as having been described in FIG. 7; therefore, the voltage VMGBPP is switched from 1 V (voltage VDD) to 5V (voltage VPPA) and the voltage VMGBPN is switched from 1 V (voltage VDD) to 3V (voltage VPPC) and input to the block decoder 24a. Here, the voltage VMGBPN and the voltage VMGBNN do not change from 0 V.

Similarly, switching is performed in the high voltage switch circuit 25; therefore, the voltage VMGPP is switched from 1 V (voltage VDD) to 5 V (voltage VPPA) and the voltage VMGNP is switched from 1 V (voltage VDD) to 3 V (voltage VPPC) and input to the gate decoder 24b. Here, the voltage VMGPN and the voltage VMGNN do not change from 0 V.

The high voltage decode circuit 24 is kept as the following relationship: the voltage control line MGBPL_s=voltage control line MGBPL_u=voltage control line MGBNL_s=voltage control line MBBNL_u=0 V.

The high voltage decode circuit 24 sets the voltage control lines MGPL_s and MGPL_u from 1 V (voltage VDD) to 5 V (voltage VPPA), and the voltage control lines MGNL_s and MGNL_u from 1 V (VDD) to 3 V (voltage VPPC). At this point, the memory gates MG are all kept in the none-selected state (0 V).

At the time T2, when it becomes in the writing applied state and a pulse applied address is selected, the high voltage decode circuit 24 sets the voltage control line MGBPL_s from 0 V to 5 V (voltage VMGBPP), the voltage control line MGPL_s from 5 V to 0 V (voltage VMGPN), and the voltage MGNL_s from 3 V to 0 V (voltage VMGNN). Here, the voltage control line MGBNL_s is not changed from 0 V (voltage VMGBNN).

In this stage, only the selected block/selected memory gate MG changes from 0 V to 5 V (voltage control line MGBPL_S) and the other memory gates MG are kept in the non-selected state (0 V).

When the boosting voltage shifts from the intermediate level to the pulse applied level at the time T3, the voltage VPPA changes from 5 V to 11 V. Here, the other boosting voltages are kept as they are.

At the same time, switching is performed in the high voltage switch circuit 25, as having been described in FIG. 7; therefore, the voltage VMGBPP is switched from 5 V to 11 V (voltage VPPA), the voltage VMGBPN is switched from 0 V to 3 V (voltage VPPC), the voltage VMGBNP is switched from 3 V to 1 V (voltage VDD), and the voltage VMGBNN is switched from 0 V to −0.5 V (voltage VEES) and input to the block decoder 24a.

The voltage VMGPP is switched from 5 V to 11 V (voltage VPPA), the voltage VMGPN is switched from 0 V to 3 V (voltage VPPC), and the voltage VMGNN is switched from 0 V to 1 V (voltage VDD) and input to the gate decoder 24b. The voltage VMGNP is not changed from 3 V (voltage VPPC).

The high voltage decode circuit 24 changes the voltage control line MGBPL_s from 5 V to 11 V (voltage VMGBPP), the voltage control line MGBNL_s from 0 V to 1 V (voltage VMGBNP), the voltage control line MGPL_s from 0 V to 3 V (voltage VMGPN), and the voltage control line MGNL_s from 0 V to 1 V (voltage VMGNN).

The high voltage decode circuit 24 changes the voltage control line MGBPL_u from 0 V to 3 V (voltage VMGBPN), the voltage control line MGBNL_u from 0 V to 1 V (voltage VMGBNP), and the voltage control line MGPL_u from 5 V to 11 V (voltage VMGPP). The above circuit does not change the voltage control line MGNL_u from 3 V (voltage VMGNP).

As the result, the selected block/selected MG becomes from 5 V to 11 V (voltage control line MGBPL_s), and all the selected block/non-selected MG and the selected/non-selected MG in the non-selected block become from 0 V to 1 V (voltage VDD).

Next, the operation in the erasing will be described. FIGS. 17A and 17B are timing charts for use in describing the voltages and the voltage control lines in the erasing operation mode.

With reference to FIGS. 17A and 17B, the [IS] is the initial state before erasing start, similar to the state [IS] of FIGS. 16A and 16B.

A symbol [EH] shows the erasing wait state before applying an erasing pulse. In short, it is in the middle state capable of switching the address input to the high voltage decode circuit 24. A symbol [EP] shows the applied state of the erasing pulse.

The state starts from shifting from the [IS] to the [EH] at the time T4. At the time T5, an address whereto input a pulse is selected and at the time T6, the state starts shifting from the [EH] to the [EP]. The state of the [IS] is similar to FIGS. 16A and 16B.

The boosting voltage is activated at the time T4. The boosting circuit 26 changes the voltage VPPA from 1 V to 5 V, the voltage VPPC from 1 V to 3 V, the voltage VEEM from 0 V to −3 V, and the voltage VEES from 0 V to −0.5 V.

The high voltage switch circuit 25 changes the voltage VMGBPP from 1 V (VDD) to 5 V (voltage VPPA) and the voltage VMGBNP from 1 V (voltage VDD) to 3 V (voltage VPPC) and outputs the above to the block decoder 24a.

The relation does not change as the voltage VMGBPN=voltage VMGBNN=0 V. Similarly, the high voltage switch circuit 25 changes the voltage VMGPP from 1 V (voltage VDD) to 5 V (voltage VPPA) and the voltage VMGNP from 1 V (voltage VDD) to 5 V (voltage VPPA) and outputs the above to the gate decoder 24b. Here, the voltage VMGPN and the voltage VMGNN do not change from 0 V.

The high voltage decode circuit 24 does not change the voltage control lines MGBPL_s, MGBPL_u, MGBNL_s, and MGBNL_u from 0 V. On the other hand, the high voltage decode circuit 24 changes and sets the voltage control lines MGPL_s and MGPL_u from 1 V (voltage VDD) to 5 V (voltage VPPA) and the voltage control lines MGNL_s and MGNL_u from 1 V (voltage VDD) to 5 V (voltage VPPA). At this point, the memory gates MG are in the none-selected state (0 V).

When it becomes in the erasing applied state and the pulse applied address is selected at the time T5, the high voltage decode circuit 24 changes and sets the voltage control line MGBP_s from 0 V to 5 V (voltage VMGBPP). Further, the voltage control line MGBNL_s is set at 0 V (voltage VMGBNN), the voltage control line MGPL_s is set at 5 V (voltage VMGPP), and the voltage control line MGNL_s is set at 5 V (voltage VMGNP).

On the other hand, the high voltage decode circuit 24 changes and sets the voltage control line MGBPL_u from 0 V to 5 V (voltage VMGBPP), the voltage control line MGPL_u from 5 V to 0 V (voltage VMGPN), and the voltage control line MGNL_u from 5 V to 0 V (voltage VMGNN) and does not change the voltage control line MGBN_u from 0 V (voltage VMGBNN). In this stage, all the memory gates MG are still in the non-selected state (0 V).

When the boosting voltage shifts from the intermediate level to the pulse applied level at the time T6, the voltage VPPM is set from −3 V to −8 V. The other boosting signals are kept as they are.

The switching is performed in the high voltage switch circuit 25, as having been described in FIG. 7; however, the voltage VMGBPP is switched from 5 V to 11 V (voltage VPPA), the voltage VMGBPN is switched from 0 V to −0.5 V (voltage VEES), the voltage VMGBNP is switched from 3 V to 1 V (voltage VDD), and the voltage VMGBNN is switched from 0 V to −8 V (voltage VEEM) and input to the block decoder 24a.

The voltage VMGPP is switched from 5 V to 1 V (voltage VDD), the voltage VMGPN is switched from 0 V to −0.5 V (voltage VEES), the voltage VMGNP is switched from 5 V to 1 V (voltage VDD), and the voltage VMGNN is switched from 0 V to −8 V (voltage VEEM) and input to the gate decoder 24b.

The high voltage decode circuit 24 changes and sets the voltage control line MGBPL_s from 5 V to 1 V (voltage VMGBPP), the voltage control line MGBNL_s from 0 V to −8 V (voltage VMGBNN), the voltage control line MGPL_s from 5 V to 1 V (voltage VMGPP), the MGNL_s from 5 V to 1 V (voltage VMGNP). The high voltage decode circuit 24 changes the voltage control line MGBPL_u from 5 V to 1 V (voltage VMGBPP), the voltage control line MGBNL_u from 0 V to 1 V (voltage VMGBNP), the voltage control line MGPL_u from 0 V to −0.5 V (voltage VMGPN), and the voltage control line MGNL_u from 0 V to −8 V (voltage VMGNN). As the result, the selected block/selected MG is set from 0 V to −8 V (voltage control line MGBNL_S), the non-selected block/selected MG is set at Hi-Z (0 to 1 V), and all the non-selected gates MG in the selected/non-selected block are set from 0 V to 1 V (voltage VDD).

When a potential difference between the positive power source and the negative power source in each of the latch type level shifters and the driver circuits is not so large, in the high voltage decode circuit 24, a high voltage MOS transistor gate and source voltage Vgs forming the high voltage decode circuit 24 cannot be obtained enough. Accordingly, the signals cannot be processed normally.

In the [IS] state, any boosting voltage does not occur; therefore, the block decoder 24a and the gate decoder 24b are both set at the positive voltage VDD and the negative voltage VSS (0 V). The potential difference between the positive power source and the negative power source is the VDD for the positive voltage.

When the voltage VDD is low at about 1 V, the gate and source voltage Vgs cannot be obtained enough. In the state [IS], it is not necessary to change the state and therefore, even in this state, no problem occurs.

As for the writing/erasing operation, the potential difference between the positive power source and the negative power source is 3 V and more at the time T2 ([PH] state) and the time T5 ([EH] state) of switching addresses.

Since the gate and source voltage Vgs is obtained enough, the level shifter inverting operation and the gate driver load charging can be performed without any problem.

A problem in the writing occurs when the voltage VMGBNP=voltage VDD at the time T3 and later. It is necessary to set the voltage VMGBNP=voltage VDD, to set the selected block/non-selected MG at the voltage VDD. When the non-selected MG is set at a voltage higher than the voltage VDD, disturb characteristics in the memory cell is deteriorated and to assure a reliability, the voltage higher than the voltage VDD cannot be selected.

On the other hand, when considering the withstand voltage in the gate driver, the voltage lower than the voltage VDD could be sever to satisfy the condition and therefore, any other voltage than the voltage VDD cannot be selected.

Therefore, the selected block/non-selected MG has to be charged from the voltage VSS to the voltage VDD at the time T3 and later and the block decoder 24a and the gate decoder 24b require a certain degree of driving ability.

When the voltage VMGBNN=VSS continues at the time T3 and later, the gate and source voltage Vgs=VDD as for the P-channel MOS transistor of the MGBN decoder in the block decoder 24a, in the [PP] state, which cannot drive the voltage control line MGBNL_s and the selected block/non-selected MG coupled to the same line satisfactorily and cannot charge the above up to the voltage VDD.

According to the first embodiment, at the time T1 and later, the voltage VEES=−0.5 V in the [PH] and [PP] mode.

At the time T3 and later, it is set at the voltage VMGBNN=−0.5 V (voltage VEES). According to this, the P-channel MOS transistor gate and source voltage Vgs of the MGBN decoder in the block decoder 24a is magnified from 1 V to 1.5 V.

Similarly, a problem in the erasing occurs when the voltage VMGBPP=voltage VDD and the voltage VMGPP=VDD at the time T6 and later. The voltage VMGBNN and the voltage VMGNN have to be set at −8 V to apply the voltage VEEM=−8 V to the selected memory gate MG; however, from the viewpoint of the withstand voltage of the gate decoder 24b, the opposite positive voltage VMGBNP and voltage VMGNP cannot be any other than the voltage VDD.

From the viewpoint of the withstand voltage of the gate decoder 24b, it is necessary to set as the voltage VMGBPP=VDD and the voltage VMGPP=VDD.

Therefore, the select and non-selected block/non-selected MG has to be charged from the voltage VSS to the voltage VDD at the time T6 and later.

The block decoder 24a and the gate decoder 24b require a certain degree of driving ability.

When the voltage VMGBPN=voltage VSS and the voltage VMGPN=voltage VSS continue at the time T6 and later, the MGBP decoder/MGP decoder in the block decoder 24a/gate decoder 24b cannot get any other voltage than the P-channel MOS transistor gate and source voltage Vgs=voltage VDD in the [EP] state. Therefore, the voltage control lines MGBPL_s/MGBPL_u, MGPL_s and the selected and non-selected block/non-selected MG further coupled to the above cannot be driven enough and cannot be charged up to the voltage VDD satisfactorily.

When the voltage control line MGPL_u=voltage VSS keeps, the driver circuit cannot get other than the gate and source voltage Vgs=voltage VDD, which similarly disturbs charging the non-selected MG up to the voltage VDD.

According to the first embodiment, by generating the voltage VEES=−0.5 V at the time T4 and later in the [EH] and [EP] mode and setting the voltage VMGBPN=−0.5 V (voltage VEES) and the voltage VMGPN=−0.5 V (voltage VEES) at the time T6 and later, the gate and source voltage Vgs of the P-channel MOS transistor of the driver circuit in the high voltage decode circuit 24 is magnified from 1 V to 1.5 V.

According to this, the voltage control line can be charged to the voltage VDD. Here, the voltage VEES=−0.5 V is used only in the high voltage decode circuit 24 but not transmitted to the memory gate MG itself.

Accordingly, the voltage VEES does not have to be charged with a large capacity and such an ability as the other high voltage power source of charging the memory gate MG is not necessary.

In the above, although the control of the voltage supplied to the gate decoder 24b is applied to the erasing operation mode ([EH] and [EP] mode) has been described, the above can be similarly applied to the writing operation mode ([PH] and [PP] mode).

Second Embodiment

The first embodiment has described about the structure of generating the shallower negative voltage VEEM (−0.5 V) in the [PH]/[EH] state before the pulse application in the writing/erasing mode, coupling the VEES to the decoder power source in the pulse applied state [PP]/[EP], and charging the memory gate MG load at a high speed.

On the other hand, in the latch type level shifter circuit having been described in FIG. 13, the control signal terminal en has to be lowered to the voltage of a terminal UN at a low potential side and less and the input signal terminal inp/inn has to be cut, hence into a latch state, to apply a negative voltage such as −0.5 V lower than 0 V to the low potential side terminal UN.

This is because the N-channel MOS transistor of receiving the input signal cannot be completely turned off when the low potential side terminal un<0 V as the "L" level of the input signal terminal inp/inn is 0 V.

Therefore, it is indispensable to cut the input at the control signal terminal en when the low potential side terminal un<0 V. However, this disturbs the acceptance of the input; therefore, connection switching within the decoder has to be completed during the period of the low potential side terminal un=0 V and thereafter, the low potential side terminal un has to be lowered to a negative voltage.

In FIGS. 16A, 16B, 17A, and 17B, the address switching at the time T2/T5 is performed when the low potential side terminal un=0 V, without any problem; in this case, however, in the erasing state of FIGS. 17A and 17B, the selected block/non-selected MG and the non-selected block/selected MG rise up to 5 V (voltage VPPA), after switching the address.

Therefore, from the viewpoint of disturb characteristics in the memory cell, this is disadvantageous. To avoid this, it is effective that the address switching is performed at the time T3/the time T6 and later, to short the rising period of the memory gate MG. However, the low potential side terminal UN has to be shifted from 0 V to −0.5 V at the same time; therefore, considering the above restriction, signal switching timing has to be controlled in detail.

The second embodiment describes a circuit structure for realizing the above in the erasing mode and a signal switching method.

The voltage in the erasing mode of the non-selected memory gates MG occupying a large number of the memory gates MG is the VMGBN voltage (voltage control line MGBNL_u) in the non-selected block and in the first embodiment, the voltage VMGBNP=5 V (voltage VPPA) in the [EH] state.

Not to apply this voltage to the non-selected MG, the voltage VMGBNP=1 V (voltage VDD) is desired; however, when the voltage VPPA is replaced with the voltage VDD simply, the voltage between the high potential side terminal up and the low potential side terminal un of the latch type level shift circuit is too much lowered to normally operate.

Figure 18:
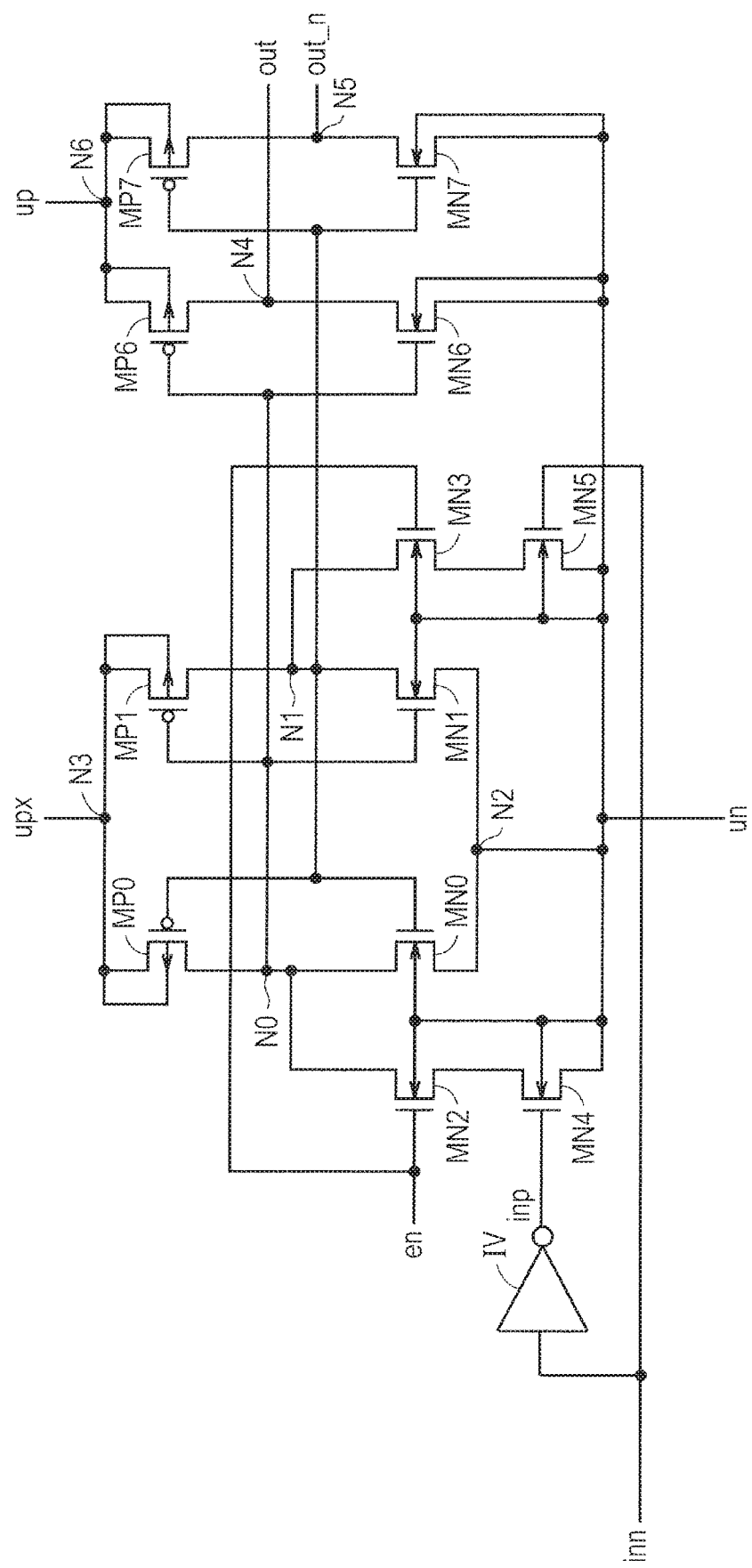
FIG. 18 is a circuit diagram for use in describing a structure of a latch type level shifter according to a second embodiment.

FIG. 18 is a circuit diagram for use in describing a structure of the latch type level shifter according to the second embodiment. With reference to FIG. 18, the high potential side terminal upx of the positive power source of the latch unit is separated from the positive potential side terminal up of the driver unit, by comparison with the latch type level shifter of FIG. 13.

It is set as the high potential side terminal upx=VPPA and the high potential side terminal up=VDD. The above structure enables both the stable operation of the level shifter and the lower power source of the output signal.

Figure 19:
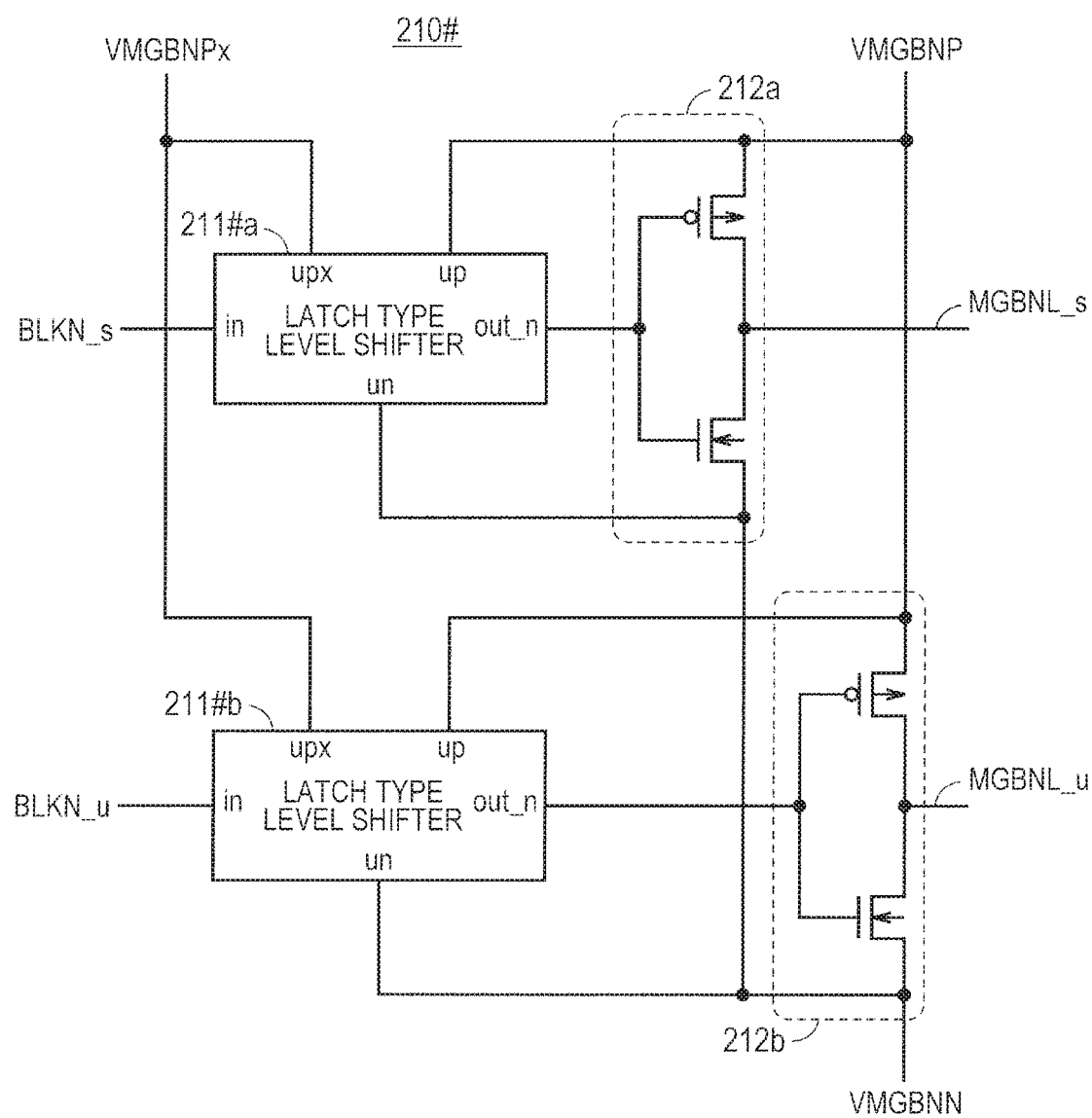
FIG. 19 is a view for use in describing a structure of the MGBN decoder in the block decoder 24a according to the second embodiment.

FIG. 19 is a view for use in describing a structure of the MGBN decoder 210# in the block decoder 24a according to the second embodiment.

With reference to FIG. 19, the latch type level shifters 211a and 211b are replaced with latch type level shifters 211#a and 211#b, differently from the structure of FIG. 10.

The latch type level shifters 211#a and 211#b are formed in the circuit structure having been described in FIG. 18.

Specifically, as having been described above, the positive potential side terminals up and upx are separated.

The structure with the positive potential side terminal upx for the latch unit and the positive potential side terminal up for the driver unit is shown.

In this circuit, upx≥up; the relation of VPPA≥VDD is automatically satisfied. This latch type level shifter is applied to the latch type level shifter having been described in FIG. 9 and the like.

According to this, it can be set as the voltage control line MGBNL_u=1 V (voltage VDD) and it is possible to avoid applying the high voltage to the non-selected MG for a long period.

Figure 20A:
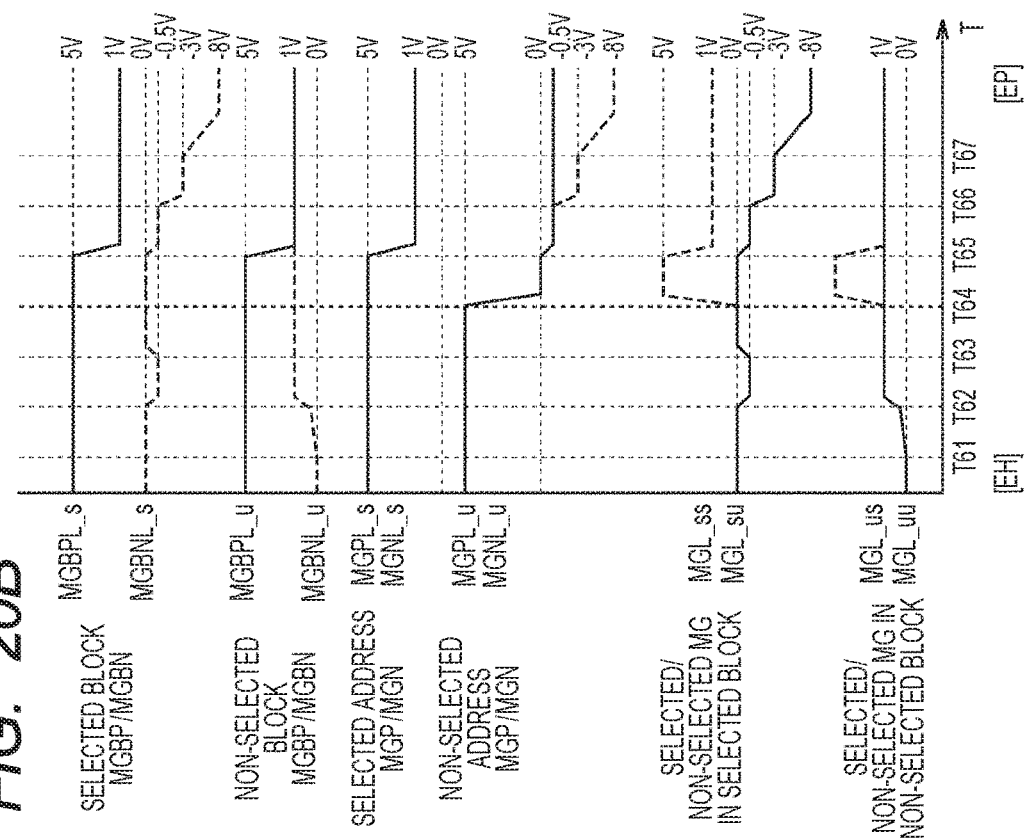
FIGS. 20A and 20B are timing charts for use in describing the voltage and the voltage control line in the erasing operation mode according to the second embodiment.
Figure 20B:
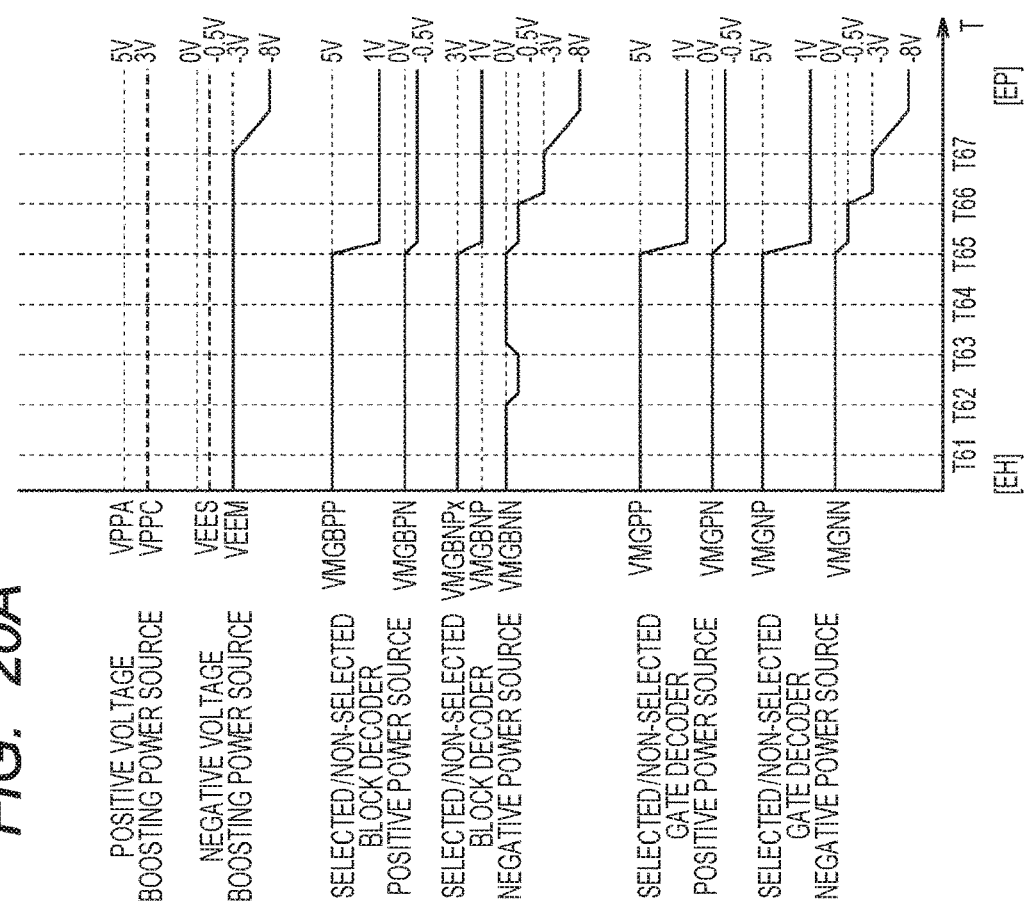

FIGS. 20A and 20B are timing charts for use in describing the voltages and the voltage control lines in the erasing operation mode according to the second embodiment.

The time T6 of switching the [EH] to [EP] is separated into the states of the time T61 to T67.

At the time T67, the erasing negative voltage VEEM is switched from −3 V to −8 V. On the other hand, all the boosting power sources keep in the same state during the period of the time T61 to T66.

Further, a voltage VMGBNPx is added as the negative power source for the block decoder 24a and the voltage VMGBNP=1 V (VDD) during the whole period.

Hereinafter, a concrete operation will be described in the time series. At first, the voltage control line MGBNL_u is switched from the voltage VMGBNN (0 V) to the voltage VMGBNP (1 V) to charge the memory gate MG in the non-selected block to the voltage VDD at the time T61. At this time, the voltage control line MGBNL_u is coupled to the memory gate lines MGL_us/MGL_uu in the non-selected block and the voltage between the positive potential side terminal up and the negative potential side terminal un of the driver unit in the MGBN decoder is low at 1 V; as the result, the power of the driver is very small for the load and the charge speed is very low.

Next, at the time T62, the voltage is set from the voltage VMGBNN=0 V to −0.5 V (voltage VEES). According to this, the voltage between the positive potential side terminal up and the negative potential side terminal un of the driver unit in the MGBN decoder rises up to 1.5 V, which resolves the power shortage of the same driver and the voltage control line MGBNL_u and the memory gate lines MGL_us/MGL_uu are charged to the voltage VDD at a high speed.

Although it is not shown, when the voltage VMGBNN=0 V is turned to −0.5 V, the control terminal en of the latch type level shifter has to be changed from 0 V to −0.5 V and at the same time, since the input of the latch is cut, the switching during this period is impossible.

By turning the voltage VMGBNN to −0.5 V, the voltage control line MGBNL_s and the memory gate lines MGL_ss/MGL_su in the selected block are also turned to −0.5 V. During this period, the voltage VEES is charged in the memory gate MG in the selected block; however, it is charged only in the selected block and the capacity to be charged is still small for all the memory gates MG.

Upon completion of the charge in the non-selected MG, the voltage VMGBNN is returned from −0.5 V to 0 V at the time T63. When the control of the control terminal en of the latch type level shifter is unified, this operation is necessary for switching the voltage control lines MGPL/MGNL after once releasing the latch. According to this, the memory gate lines MGL_ss/MGL_su in the selected block are returned to 0 V.

Thereafter, since a pulse is applied only to a desired memory gate MG in the selected block at the time T64, the voltage control lines MGPL/MGNL are switched to select the pulse applying memory gate MG.

Since a voltage higher than the voltage VDD is not applied to the memory gate MG, the voltage control lines MGPL/MGNL are in the non-selected state; however, the voltage control lines MGPL_u/MGNL_u are changed from 5 V (voltage VMGPP/VMGNP) to 0 V (voltage VMGPN/VMGNN).

At this time, the memory gate line MGL_su and the memory gate line MGL_uu temporarily start charging to 5 V (VPPA); however, at the point when the memory gate line MGL_su has been charged up to 1 V, the charging operation may be finished.

After completion of switching the voltage control lines MGPL/MGNL, the voltage of the high voltage decode circuit 24 is switched as the non-selected MG=voltage VDD at the time T65.

At first, with respect to the positive power source of the block decoder 24a, the voltage VMGBPP is switched from 5 V (voltage VPPA) to 1 V (voltage VDD) to return the non-selected MG to the voltage VDD.

According to this, the block decoder 24a sets the voltage control lines MGBPL_s/MGBPL_u also from 5 V to 1 V. The memory gate lines MGL_su/MGL_uu of the non-selected MG change from 5 V to 1 V.

As the result, the state with the non-selected MG higher than the voltage VDD appears during only one period of the time T64 to T65, and by shorting this period as much as possible, the effect of the disturb characteristics to the memory cell can be decreased.

Simultaneously, the voltage VMGBPN is shifted from 0 V to −0.5 V (voltage VEES) to secure the driving ability of the structure of the driver unit in the MGBP decoder. According to this, even after the voltage VMGBPP=1 V, the voltage between the high potential side terminal up and the low potential side terminal un of the driver unit in the MGBP decoder can be secured at 1.5 V, which can avoid the driving ability deterioration of the driver unit in the MGBP decoder caused by decreasing the voltage between the high potential side terminal up and the low potential side terminal un.

Here, the voltage VMGBPN has to be changed from 0 V to −0.5 V and at the same time, the latch type level shifter has to be turned into the latch state; however, the switching has been all completed by the time T64 and there is no problem.

At the same time, considering the withstand voltage relaxation when applying the negative voltage, with respect to the negative power source in the block decoder 24a, the voltage VMGBP is switched from 3 V (voltage VPPC) to 1 V (voltage VDD). According to this, considering the operation of the latch type level shifter of the driver unit in the MGBN decoder, the voltage VMGBNN is shifted from 0 V to −0.5 V (voltage VEES).

According to this, even after the voltage VMGBNP=1 V, the voltage between the high potential side terminal up and the low potential side terminal un of the driver unit of the MGBN decoder can be secured at 1.5 V, and the stable operation of the latch type level shifter in the MGBN decoder can be secured by lowering the voltage between the high potential side terminal up and the low potential side terminal un.

At the time T65, the voltage of the gate decoder 24b is also shifted according to the shift of the block decoder 24a.

The voltages VMGPP/VMGNP of the positive power source are switched from 5 V (voltage VPPA) to 1 V (voltage VDD), considering the withstand voltage relaxation thereafter.

According to this, the voltages VMGNP/VMGNN of the negative side power source are shifted from 0 V to −0.5 V (voltage VEES), to secure the potential difference between the high potential side terminal up and the low potential side terminal un within the gate decoder 24b.

Then, the voltage VMGBNN is switched from −0.5 V (voltage VEES) to −3 V (voltage VEEM), to apply the negative voltage to the selected MG at the time T66.

According to this, the voltage control line MGBNL_s is also changed from −0.5 V to −3 V and the voltage control line MGL_ss of the selected MG is also changed from −0.5 V to −3 V.

At the same time, to operate the MG driver circuit 23 normally, it is necessary to change the voltage VMGNN from −0.5 V (voltage VEES) to −3 V (voltage VEEM) and the voltage control line MGNL_u from −0.5 V to −3 V. This is because unless the voltage control line MGBNL_s≥voltage control line MGNL_u in the MG driver circuit 23, the negative voltage cannot be cut off for the non-selected side memory gate MG.

The switching of the block decoder 24a and the gate decoder 24b is all completed by the time T66, and from the time T67, the voltage VEEM is changed from −3 V to −8 V. According to this, the voltage control lines MGBNNL/MGBNL_s/MGL_ss are shifted from −3 V to −8 V, the voltage −8 V is applied to the selected memory cell, the memory gate lines MGL_su/MGL_us/MGL_uu of the memory gates MG other than the above are kept at the voltage VDD, and the non-selected memory cells are in the state free from any stress.

In the first embodiment, during the long period from the switching of the address in the [EH] mode to the switching in the [EP] mode, there is a period when the voltage VPPA (5V) is applied to the non-selected MG, causing the disturb characteristics to the memory cell disadvantageously. In the second embodiment, the address switching is shifted to the value of the [EP] and the voltage VEES (−0.5 V) is used at a proper timing, to shorten the period when the high voltage is applied to the non-selected MG while keeping the operation margin of the high voltage decode circuit 24, which can improve a reliability of the memory cell.

Third Embodiment

In the second embodiment, when the voltage VEES (−0.5 V) is applied to the gate decoder 24b, the latch type level shifter has to be in the latch state and therefore, during this period, selection state cannot be switched.

According to this, when the level shifter is switched after the voltage VEES is applied to secure the operation margin, once the voltage VEES has to be returned to the voltage VSS, then the latch type level shifter has to be switched, and then the voltage VEES has to be applied again, which complicates the control.

Figure 21:
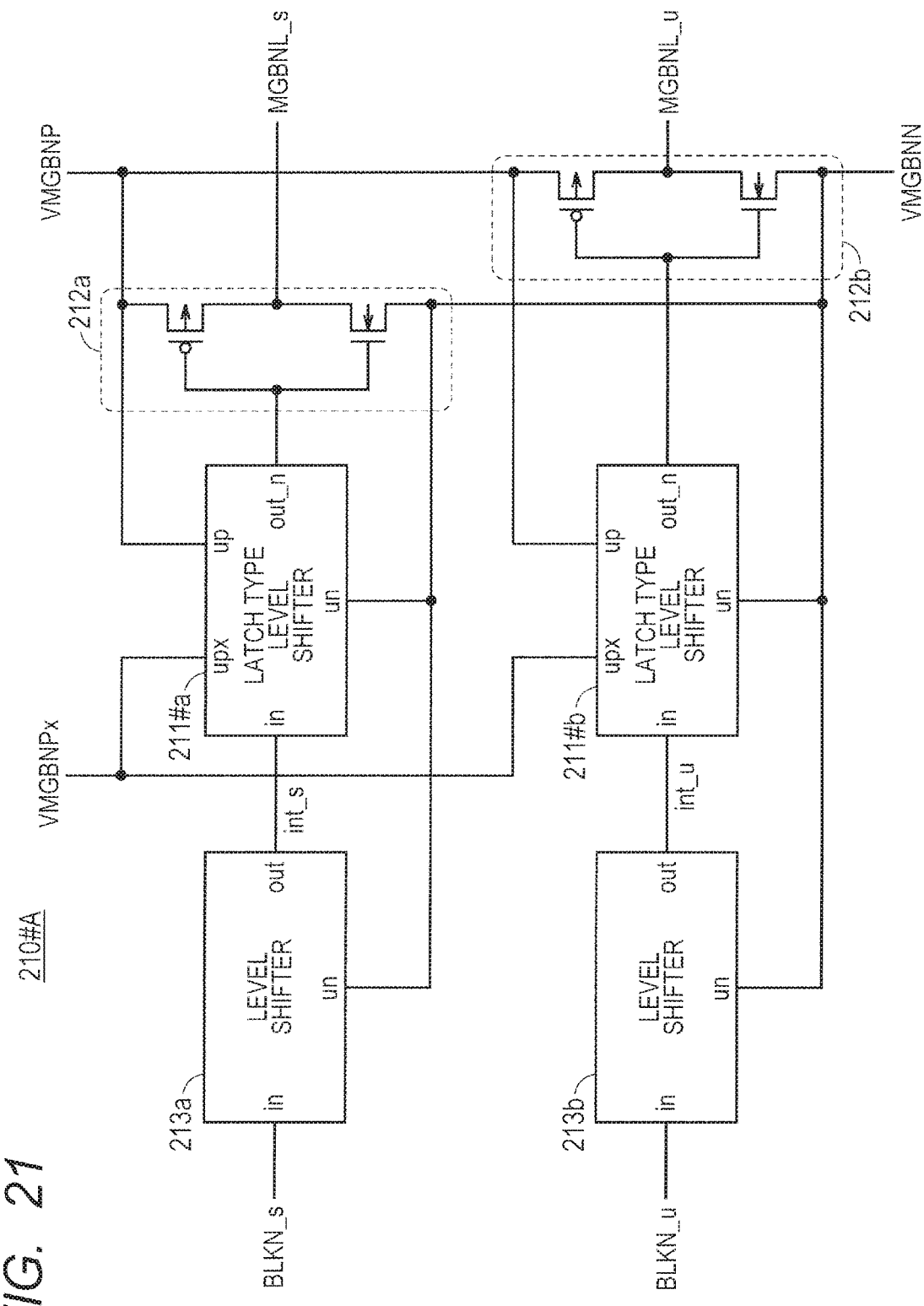
FIG. 21 is a view for use in describing a structure of the MGBN decoder in the block decoder 24a according to a third embodiment.

FIG. 21 is a view for use in describing a structure of an MGBN decoder 210#A in the block decoder 24a according to a third embodiment.

With reference to FIG. 21, level shifters 213a and 213b are provided in the prior stage to the latch type level shifters 211a and 211b, differently from the structure of FIG. 19. They are totally referred to as the level shifter 213.

The other structure is the same as the structure having been described above, and therefore, the detailed description thereof is not repeated.

Figure 22:
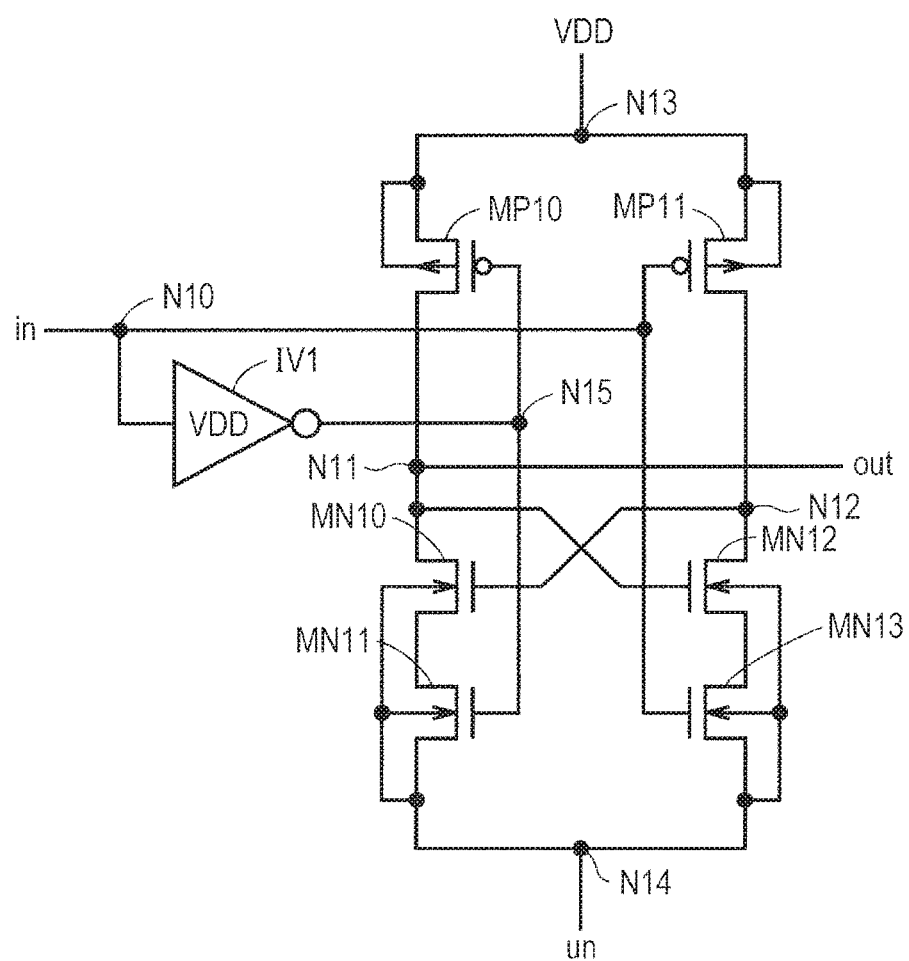
FIG. 22 is a view for use in describing a structure of a level shifter 213 according to the third embodiment.

FIG. 22 is a view for use in describing the structure of a level shifter 213 according to the third embodiment. With reference to FIG. 22, the level shifter 213 includes P-channel MOS transistors MP10 and MP11, N-channel MOS transistors MN10 to MN13, and an inverter IV1.

The inverter EV1 outputs the signal obtained by inverting the input signal in to the node N15. The P-channel MOS transistor MP10 is provided between the node N13 and the node N11 and its gate is coupled to the node N15.

The P-channel MOS transistor MP11 is provided between the node N13 and the node N12 and its gate is coupled to the node N10.

The voltage VDD is supplied to the node N13. The N-channel MOS transistors MN10 and MN11 are provided between the node N11 and the node N14 and the gates thereof are coupled to the node N12 and the node N15 respectively.

The N-channel MOS transistors MN12 and MN13 are provided between the node N12 and the node N14 in parallel with the N-channel MOS transistors MN10 and MN11 and the gates thereof are coupled to the node N11 and the node N10 respectively.

The node N14 is coupled to the low potential side terminal un. The node N10 receives the input signal in.

When the input signal in is set at the "L" level, the N-channel MOS transistors MN10 and MN11 are turned on. According to this, the node N11 is set at the "L" level.

When the input signal in is set at the "H" level, the P-channel MOS transistor MP10 is turned on. According to this, the node N11 is set at the "H" level.

The input signals BLKN_s/BLKN_u are converted into the intermediate signals int_s/int_u of the VDD/VMGBNN level by the level shifter 213 and input to the latch type level shifter 211. They are finally converted into one voltage level of the voltages VMGBNP/VMGBNN and output to the voltage control line MGBNL_s/MGBNL_u.

The "L" level of the intermediate signals int_s/int_u is converted into the voltage VMGBNN; the latch type level shifter 211 does not have to cut the input signal with the control signal en but can cut the N-channel MOS transistor at the non-selected side only with the intermediate signals int_s/int_u. Therefore, even when the low potential side terminal un is turned negative, inversion of the level shifter 211 is possible and switching of the state can be performed even in the voltage VEES effective state. As the result, switching control can be simplified.

Fourth Embodiment

In a fourth embodiment, generation of the voltage VEES will be described.

Figure 23:
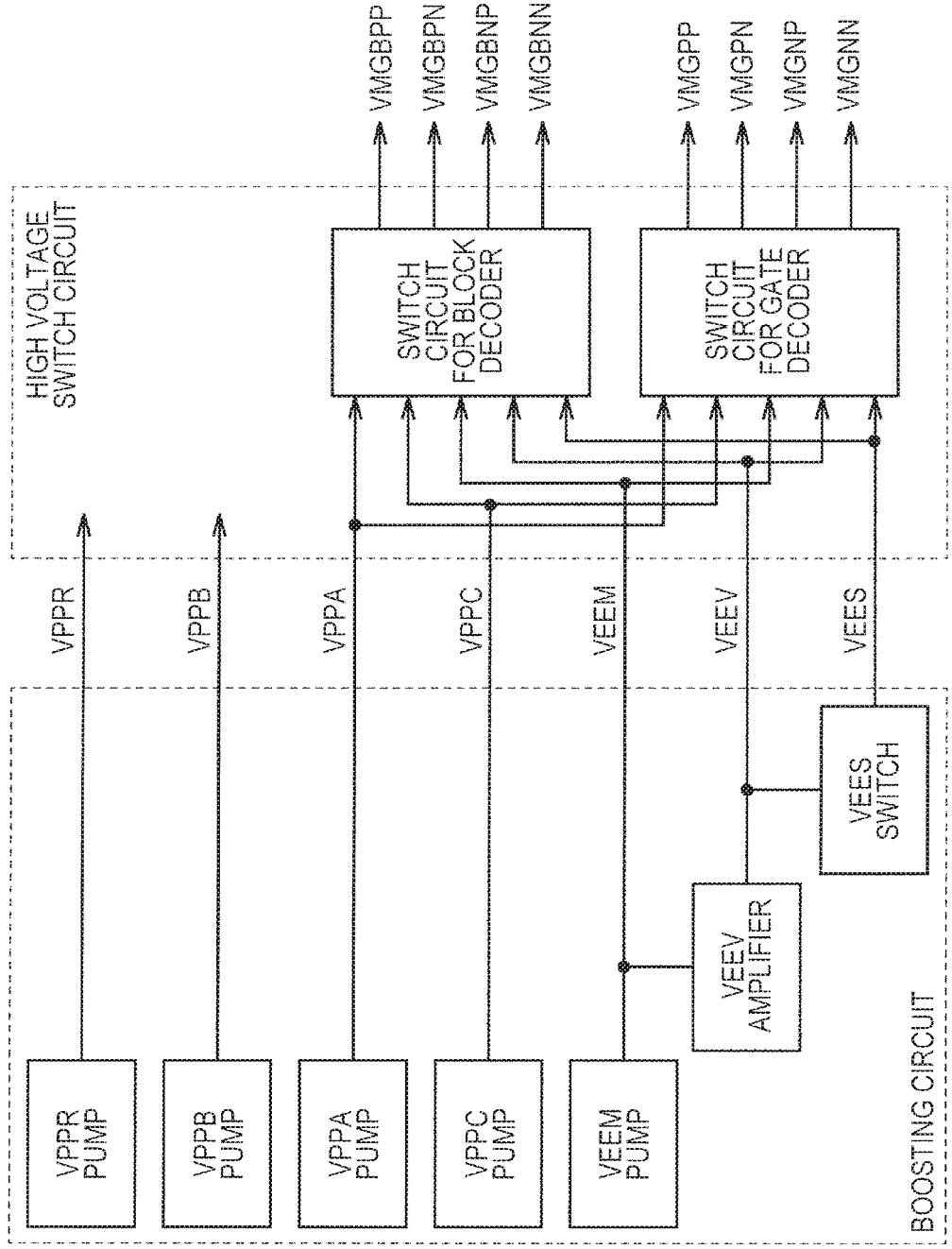
FIG. 23 is a block diagram for use in describing a boosting circuit and a high voltage switch circuit according to a fourth embodiment.

FIG. 23 is a block diagram for use in describing the boosting circuit and the high voltage switch circuit according to the fourth embodiment.

With reference to FIG. 23, charge pumps of respectively outputting the voltages VPPR, VPPA, VPPB, VPPC, and VEEM are provided.

In this example, the case of generating the voltage VEEV according to the voltage VEEM is shown. Further, the case of generating the voltage VEES according to the voltage VEEV is shown.

The voltage VEEV is the negative voltage applied to the memory gate MG in the erasing verify mode. In this embodiment, the voltage VEEV is the voltage to be generated in a regulator and the like according to the voltage VEEM. In the embodiment, the verify operation is omitted and the detail thereof is not described; however, it is a necessary voltage in the erasing verify mode.

Accordingly, it is not used in the states [PH]/[PP]/[EH]/[EP] other than the verify state. In this state, the VEEV amplifier generates −0.5 V.

By conducting the VEES switch, the voltage VEES generated by the VEEV amplifier is supplied.

According to the above structure, any charge pump does not have to be newly provided, which is advantageous from the point of area.

The switch circuit for the block decoder is the circuit having been described in FIG. 5. The switch circuit for the gate decoder is the circuit having been described in FIG. 6.

Figure 24:
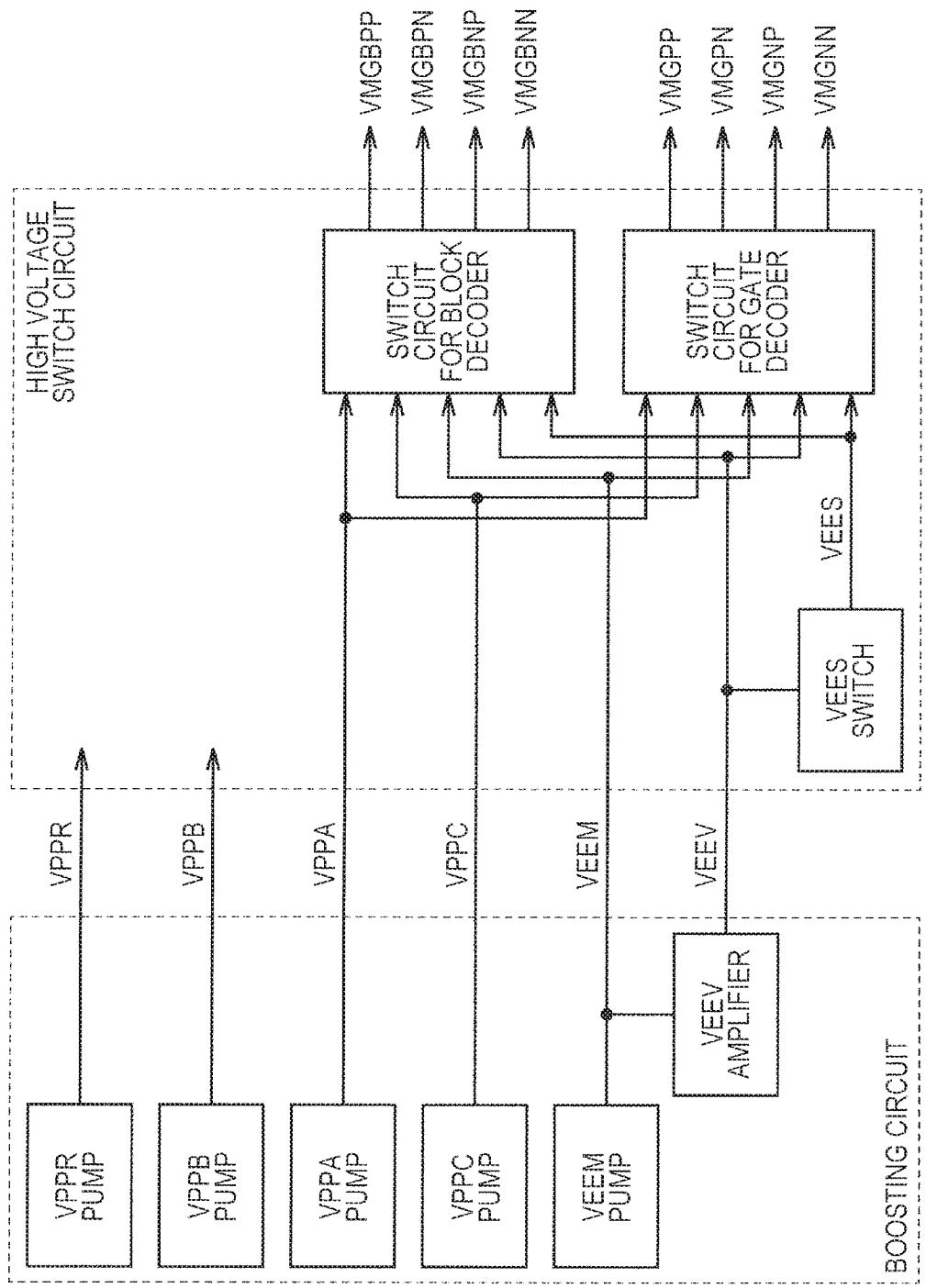
FIG. 24 is a block diagram for use in describing a boosting circuit and a high voltage switch circuit according to a modified example of the fourth embodiment.

FIG. 24 is a block diagram for use in describing the boosting circuit and the high voltage switch circuit according to a modified example of the fourth embodiment.

With reference to FIG. 24, the structure of the high voltage switch circuit is different from the structure of FIG. 23. Specifically, the VEES switch is provided within the high voltage switch circuit, differently from FIG. 23. The other structure is the same and the detailed description thereof is not repeated.

Figure 25:
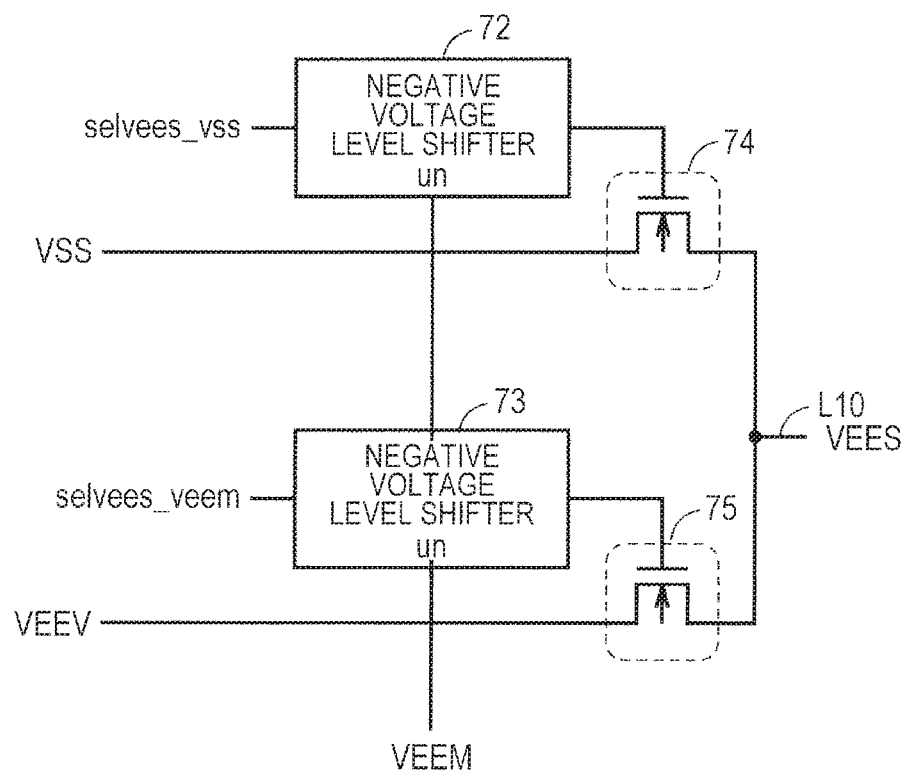
FIG. 25 is a view for use in describing a structure of a VEES switch according to the fourth embodiment.

FIG. 25 is a view for use in describing the structure of the VEES switch according to the fourth embodiment. With reference to FIG. 25, the voltage control line L10 supplies the voltage VEES.

The voltage VSS is supplied to the voltage control line L10 via the switch 74 and the voltage VEEV is supplied there via the switch 75.

The select signal selvees_vss is input to the gate of the switch 74 via the negative voltage level shifter 72.

The select signal selvees_veem is input to the gate of the switch 75 via the negative voltage level shifter 73.

According to the operation mode, one of the voltages VSS and VEES is selected and supplied to the voltage control line L10 as the voltage VEES.

The voltage VSS/VSSV levels are switched in the N-channel MOS transistor according to the elect signal selvees_vss and the selvees_veem.

This circuit can be formed by only two N-channel MOS transistors for switches and two negative voltage level shifters for driving the switches, and it can be realized in a smaller area than the structure of newly adding the charge pump or the regulator.

Fifth Embodiment

In a fifth embodiment, a structure of using the voltage VEES in the high voltage switch circuit will be described.

Figure 26:
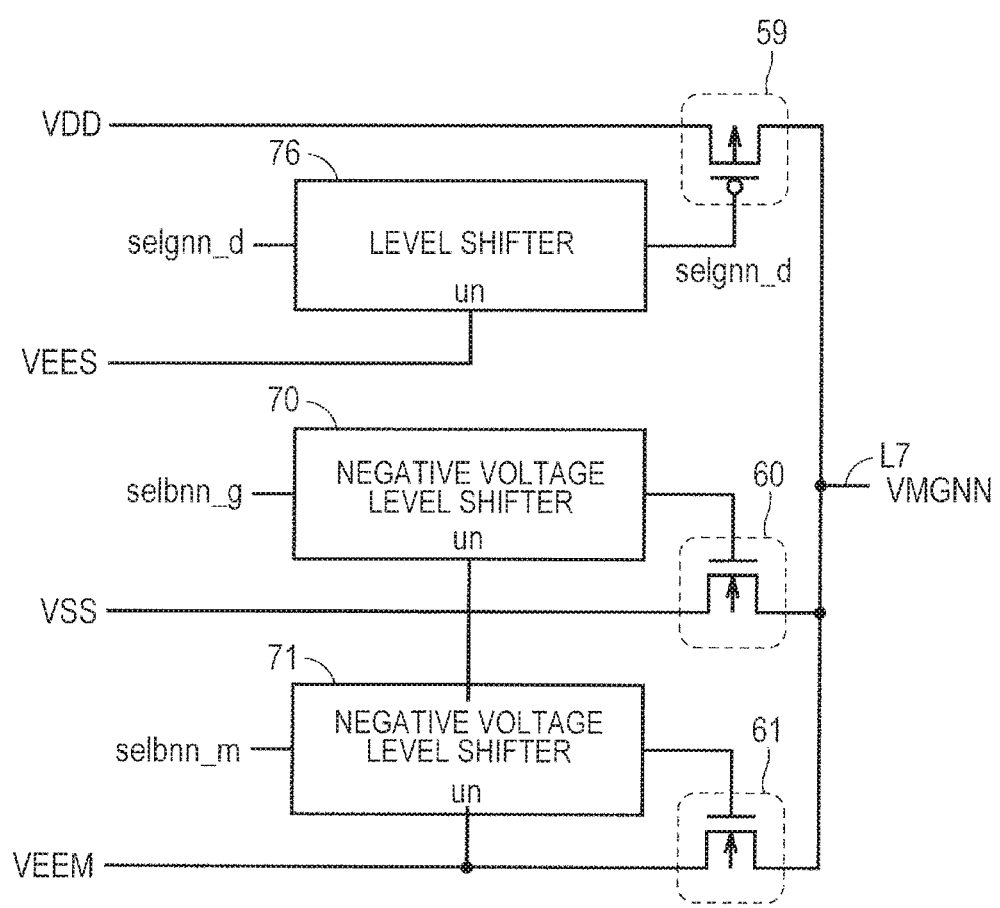
FIG. 26 is a view for use in describing a high voltage switch circuit according to a fifth embodiment.

FIG. 26 is a view for use in describing the high voltage switch circuit according to the fifth embodiment. FIG. 26 shows a circuit of generating the voltage VMGNN.

Differently from the structure having been described in FIG. 6D, a level shifter 76 is provided in the gate of the switch 59. The other structure is the same as the structure of FIG. 6D and the detailed description thereof is not repeated.

Specifically, the same circuit as the level shifter 213 having been described in FIG. 22 can be used.

When the gate of the switch 59 of the P-channel MOS transistor has the voltage VDD/VSS levels in FIG. 6D, the gate and source voltage Vgs of the P-channel MOS transistor is not any other than the voltage VDD and even when executing the low voltage VDD measures of the MG driver circuit using the voltage VEES, finally, the switch of this P-channel MOS transistor determines the driving ability. As the result, the low voltage VDD measures cannot be fully executed on the whole.

According to the fifth embodiment, the "L" level voltage of the gate of the P-channel MOS transistor is lowered to the voltage VSSE.

According to this, the gate and source voltage Vgs of the P-channel MOS transistor is relaxed from the voltage VDD to the voltage VDD-VEES.

For example, the above voltage is relaxed from 1 V to 1.5 V under the condition of the voltage VDD (1 V)/voltage VEES (−0.5 V).

Accordingly, the driving ability is not restricted by the switch of the P-channel MOS transistor of the high voltage switch circuit 25, and therefore, the low voltage VDD measures of the MG driver circuit using the voltage VEES works effectively.

This structure can be generally used when the switch of the P-channel MOS transistor passes the signals of the voltage VDD level, and by providing the level shifter 76, because of using the existing voltage VEES, the structure can be realized at ease.

As set forth hereinabove, this disclosure has been concretely described according to the embodiments, and this disclosure, however, is not restricted to the embodiments but needless to say, various modifications are possible without departing from its spirit.

What is claimed is:

1. A semiconductor device comprising:
   first and second memory blocks each including a plurality of memory transistors for storing data according to a level change of a threshold voltage and a plurality of memory gate lines for supplying each voltage to each gate of the transistors;
   first and second voltage control lines provided correspondingly to the first memory block, for driving the memory gate lines;
   third and fourth voltage control lines provided correspondingly to the second memory block, for driving the memory gate lines;
   a first decoder of driving the first and third voltage control lines;
   a second decoder of driving the second and fourth voltage control lines; and
   a voltage control circuit of controlling a voltage supplied to the first and second decoders,
   wherein the voltage control circuit
     supplies a first voltage and a second voltage lower than the first voltage to the first decoder and supplies a third voltage between the first voltage and the second voltage and the second voltage to the second decoder, before a writing operation and
     supplies the first voltage and the third voltage to the first decoder and supplies a fourth voltage between the third voltage and the second voltage and a fifth voltage lower than the second voltage to the second decoder, in the writing operation.

2. The device according to claim 1, further comprising:
fifth and sixth voltage control lines of controlling one of the memory gate lines in the first memory block and one of the memory gate lines in the second memory block in common;
seventh and eighth voltage control lines of controlling another of the memory gate lines in the first memory block and another of the memory gate lines in the second memory block in common;
a third decoder of driving the fifth and seventh voltage control lines;
a fourth decoder of driving the sixth and eighth voltage control lines; and
a second voltage control circuit of supplying each voltage to the third decoder and the fourth decoder,
wherein the second voltage control circuit
supplies the first voltage and the second voltage to the third decoder and supplies the first voltage and the second voltage to the fourth decoder, before the writing operation, and
supplies the fourth voltage and the fifth voltage to the third decoder and supplies the fourth voltage and the sixth voltage to the fourth decoder, in the writing operation.

3. The device according to claim 2, wherein the first to fourth decoders include
first to fourth driver circuits provided correspondingly to the first to fourth voltage control lines, to drive the corresponding voltage control lines, and
first to fourth level shifters provided correspondingly to the first to fourth driver circuits, to convert a voltage level of each input signal and output the same to the corresponding driver circuits.

4. The device according to claim 3, wherein the first level shifter supplies the first voltage to the first voltage control line by driving the first driver circuit according to the third voltage in the writing operation,
wherein the second level shifter supplies the fourth voltage to the second voltage control line by driving the second driver circuit according to the fifth voltage in the writing operation,
wherein the third level shifter supplies the third voltage to the third voltage control line by driving the third driver circuit according to the first voltage in the writing operation, and
wherein the fourth level shifter supplies the fourth voltage to the fourth voltage control line by driving the fourth driver circuit according to the fifth voltage in the writing operation.

5. The device according to claim 4,
wherein each of the first to the fourth driver circuits includes a first conductivity type transistor and a second conductivity type transistor for respectively driving the corresponding voltage control lines, and
wherein in the writing operation, when the fifth voltage is applied to the gate of the first conductivity type transistor, the fourth voltage is supplied to the corresponding voltage control line.

6. A semiconductor device comprising:
first and second memory blocks including a plurality of memory transistors of storing data according to a level change of threshold voltage and a plurality of memory gate lines of supplying each voltage to each gate of the memory transistors;
first and second voltage control lines provided correspondingly to the first memory block, for driving the memory gate lines;
third and fourth voltage control lines provided correspondingly to the second memory block, for driving the memory gate lines;
a first decoder of driving the first and third voltage control lines;
a second decoder of driving the second and fourth voltage control lines; and
a first voltage control circuit of controlling a voltage supplied to the first and second decoders,
wherein the first voltage control circuit
supplies a first voltage and a second voltage lower than the first voltage to the first decoder and supplies a third voltage between the first voltage and the second voltage and the second voltage to the second decoder, before an erasing operation, and
supplies a fourth voltage between the third voltage and the second voltage and a fifth voltage lower than the second voltage to the first decoder and supplies the fourth voltage and a sixth voltage lower than the fifth voltage to the second decoder, in the erasing operation.

7. The device according to claim 6, further comprising:
fifth and sixth voltage control lines of controlling one of the memory gate lines in the first memory block and one of the memory gate lines in the second memory block in common;
seventh and eighth voltage control lines of controlling another of the memory gate lines in the first memory block and another of the memory gate lines in the second memory block in common;
a third decoder of driving the fifth and seventh voltage control lines;
a fourth decoder of driving the sixth and eighth voltage control lines; and
a second voltage control circuit of supplying each voltage to the third decoder and the fourth decoder,
wherein the second voltage control circuit
supplies the first voltage and the second voltage to the third decoder and supplies the first voltage and the second voltage to the fourth decoder, before the erasing operation, and
supplies the fourth voltage and the fifth voltage to the third decoder and supplies the fourth voltage and the sixth voltage to the fourth decoder, during the erasing operation.

8. The device according to claim 7, wherein the first to fourth decoders include
first to fourth driver circuits provided correspondingly to the first to fourth voltage control lines to drive the corresponding voltage control lines, and
first to fourth level shifters provided correspondingly to the first to fourth driver circuits to convert a voltage level of each input signal and output the same to the corresponding driver circuits.

9. The device according to claim 8,
wherein the first level shifter supplies the fourth voltage to the first voltage control line by driving the first driver circuit according to the fifth voltage in the erasing operation,
wherein the second level shifter supplies the fifth voltage to the second voltage control line by driving the second driver circuit according to the fourth voltage in the erasing operation,
wherein the third level shifter supplies the fourth voltage to the third voltage control line by driving the third driver circuit according to the fifth voltage in the erasing operation, and wherein the fourth level shifter supplies the fourth voltage to the fourth voltage control line by driving the fourth driver circuit according to the sixth voltage in the erasing operation.

10. The device according to claim 9,
wherein each of the first to fourth driver circuits includes a first conductivity type transistor and a second conductivity type transistor for respectively driving the corresponding voltage control lines, and
wherein in the erasing operation, when the fifth voltage or the sixth voltage is applied to the gate of the first conductivity type transistor, the fourth voltage is supplied to the corresponding voltage control line.

11. The semiconductor device according to claim 8, wherein each of the first to fourth level shifters includes
a latch circuit of latching the input signal, and
a driver of converting a voltage level of a signal of the latch circuit and outputting the same.

12. The device according to claim 11, wherein the first voltage control circuit supplies the respectively different voltages to the latch circuit and the driver.

13. The device according to claim 8, wherein the first to fourth decoders further includes fifth to eighth level shifters, respectively provided correspondingly to the first to fourth level shifters, to output a converted input signals obtained by converting the voltage levels of the input signals to the respectively corresponding level shifters.

14. The device according to claim 6, wherein the fifth and sixth voltages are generated by a common negative power source circuit.

15. The device according to claim 14, further comprising
a voltage generating circuit of generating the fifth voltage according to the second voltage and the sixth voltage,
wherein the voltage generating circuit includes
first and second negative voltage level shift circuits,
a first switch transistor of a first conductivity type in which the second voltage is coupled to its source, its drain is coupled to an output node, and its gate receives an output of the first negative voltage level shift circuit, and
a second switch transistor of the first conductivity type in which its drain is coupled to the output node in parallel with the first conductivity type transistor, the sixth voltage is coupled to its source, and its gate receives the output of the second negative voltage level shift circuit.

* * * * *